US012197830B1

(12) United States Patent
Usui et al.

(10) Patent No.: US 12,197,830 B1
(45) Date of Patent: Jan. 14, 2025

(54) APPARATUS AND METHOD FOR AUTOMATIC PIN PLACEMENT IN INJECTION MOLDING

(71) Applicant: Proto Labs, Inc., Maple Plain, MN (US)

(72) Inventors: Shuji Usui, Minneapolis, MN (US); Jack Allan Rulander, Elk River, MN (US)

(73) Assignee: Proto Labs, Inc., Maple Plain, MN (US)

( * ) Notice: Subject to any disclaimer, the term of this patent is extended or adjusted under 35 U.S.C. 154(b) by 0 days.

(21) Appl. No.: 18/615,614

(22) Filed: Mar. 25, 2024

(51) Int. Cl.
*G06F 30/27* (2020.01)

(52) U.S. Cl.
CPC .................... *G06F 30/27* (2020.01)

(58) Field of Classification Search
None
See application file for complete search history.

(56) References Cited

U.S. PATENT DOCUMENTS

| 8,239,284 B2 | 8/2012 | Lukis et al. | |
|---|---|---|---|
| 10,274,933 B2 | 4/2019 | Coffman et al. | |
| 2003/0160362 A1* | 8/2003 | Fithian | B29C 45/2628 264/328.12 |
| 2008/0115099 A1* | 5/2008 | Patra | G06F 30/394 716/135 |
| 2019/0109018 A1* | 4/2019 | Balaraman | H01L 23/49811 |
| 2022/0371244 A1* | 11/2022 | Legum | B33Y 30/00 |
| 2023/0047911 A1* | 2/2023 | Cavitt | G06F 30/347 |

OTHER PUBLICATIONS

Jorge Manuei Mercado-Colmenero et al; A new procedure for the automated design of ejection systems in injection molds; Robotics and Computer-Integrated Manufacturing; vol. 46, Aug. 2017, pp. 68-85.
Jing Wang et al; Research on automatic generation technology of ejector pin for injection mold; The International Journal of Advanced Manufacturing Technology vol. 108, pp. 485-498 (2020) Published: May 15, 2020.
Jing Wang et al; Algorithm for automatic boss feature recognition and ejector sleeve design; The International Journal of Advanced Manufacturing Technology vol. 97, pp. 583-597 (2018) Published: Apr. 7, 2018.

* cited by examiner

*Primary Examiner* — James A Thompson
(74) *Attorney, Agent, or Firm* — Caldwell Intellectual Property Law

(57) ABSTRACT

An apparatus for automatic pin placement in injection molding, the apparatus includes at least a processor and a memory containing instructions configuring the at least a processor to receive part data containing a part model, identify a set of part features as a function of the part data, determine a plurality of pin placement configurations, wherein determining the plurality of pin placement configurations includes determine a plurality of pin locations based on the set of part features and determine a desired pin diameter at each pin location of the plurality of pin locations, generate a pin placement schema as a function of the plurality of pin placement configurations, and integrating the pin placement schema into the part model.

20 Claims, 17 Drawing Sheets

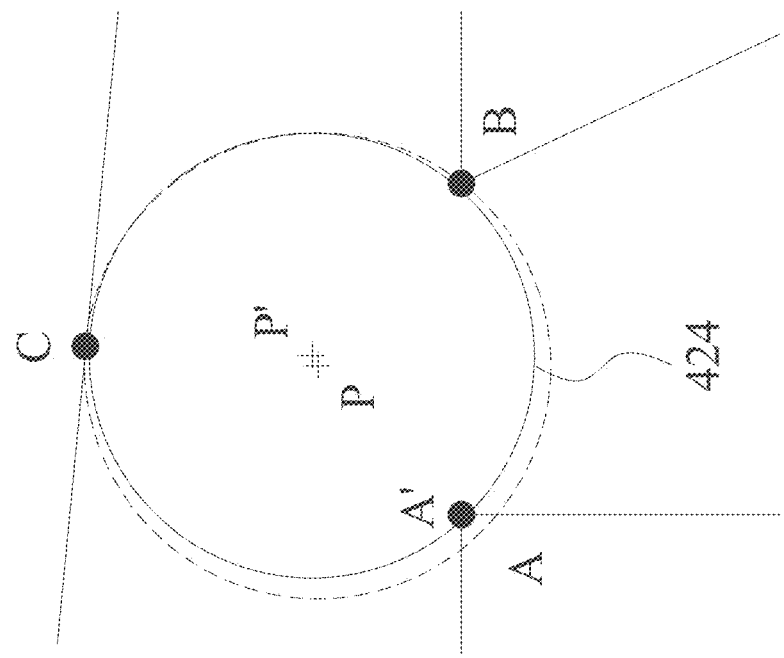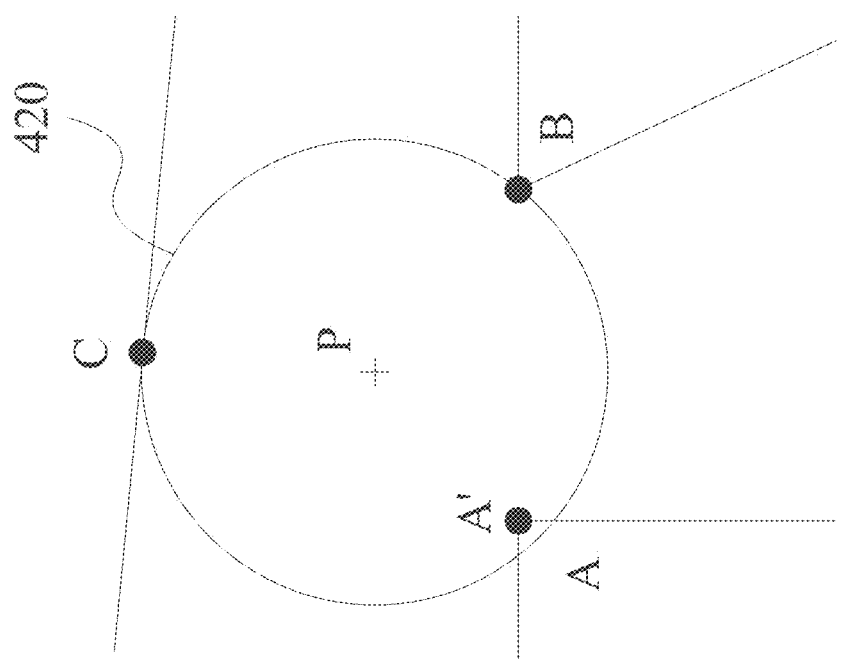
FIG. 4B

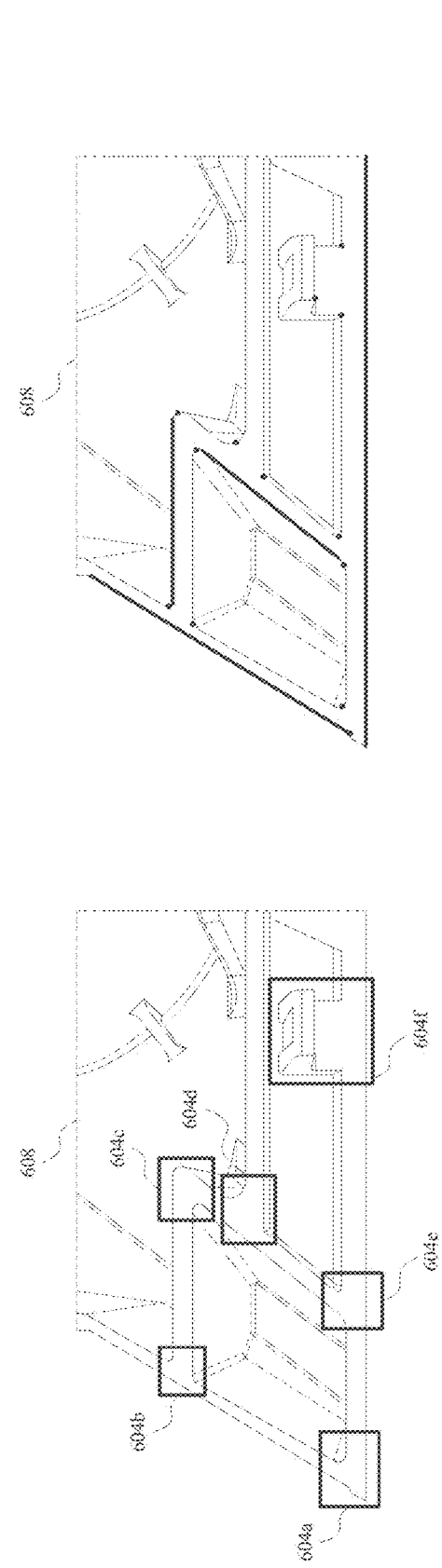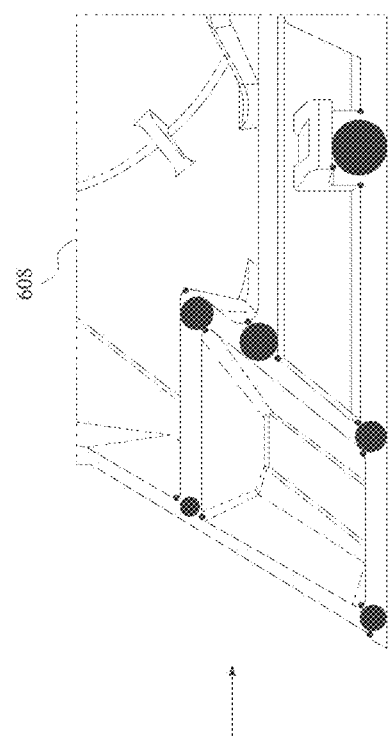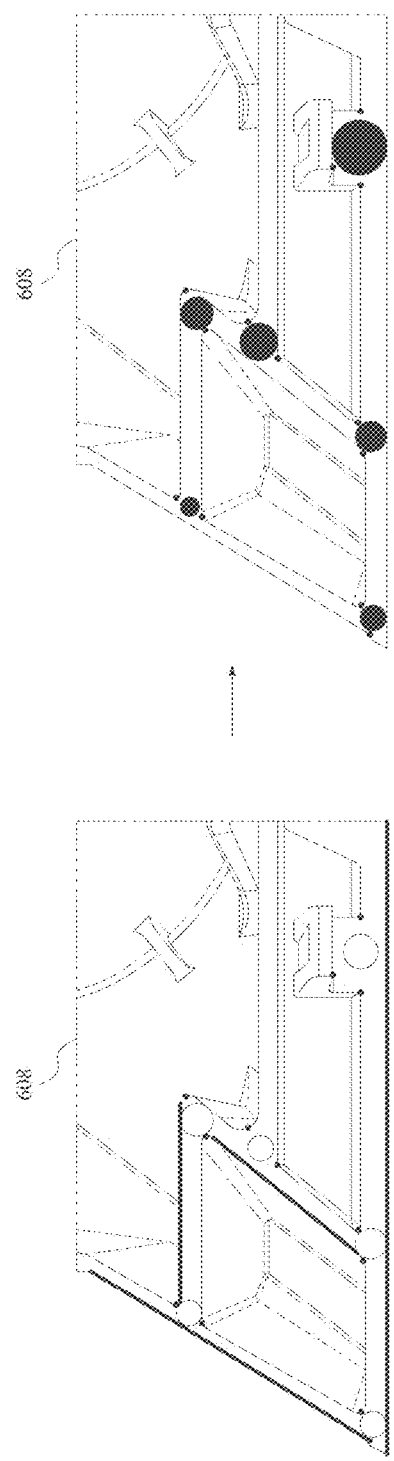

APPARATUS AND METHOD FOR AUTOMATIC PIN PLACEMENT IN INJECTION MOLDING

FIELD OF THE INVENTION

The present invention generally relates to the field of injection molding. In particular, the present invention is directed to apparatus and method for automatic pin placement in injection molding.

BACKGROUND

Pin placement may play a pivotal role in maintaining structural integrity of the molded part during the ejection phase of injection molding, ensuring an even distribution of the ejection force. Traditionally, pin placement in injection molding has been a manual process, relying heavily on the expertise and judgment of the mold designer. However, with the increasing complexity of parts, quick quotation turn-around, and demand for both quality and quantity, there is a growing need for more systematic and automated approaches to pin placement.

SUMMARY OF THE DISCLOSURE

In an aspect, an apparatus for automatic pin placement in injection molding is described. The apparatus includes at least a processor; and a memory communicatively connected to the at least a processor, wherein the memory contains instructions configuring the at least a processor to receive part data related to at least a part, wherein the part data includes a part model associated with the at least a part, identify a set of part features as a function of the part data, determine a plurality of pin placement configurations, wherein determining the plurality of pin placement configurations includes determine a plurality of pin locations based on the set of part features and determine a desired pin diameter at each pin location of the plurality of pin locations. The processor may be further configured to generate a pin placement schema as a function of the plurality of pin placement configurations and integrate the pin placement schema into the part model.

In another aspect, a method for automatic pin placement in injection molding is described. The method includes receiving, by at least a processor, part data related to at least a part, wherein the part data includes a part model associated with the at least a part, identifying, by the at least a processor, a set of part features as a function of the part data, determining, by the at least a processor, a plurality of pin placement configurations, wherein determining the plurality of pin placement configurations includes determining a plurality of pin locations based on the set of part features, and determining a desired pin diameter at each pin location of the plurality of pin locations. The method further includes generating, by the at least a processor, a pin placement schema as a function of the plurality of pin placement configurations, and integrating, by the at least a processor, the pin placement schema into the part model.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 4B is a series of geometric diagrams demonstrating an alternative method for calculating pin diameter threshold at an intersection;

FIGS. 6A-D illustrate an exemplary embodiment of a workflow of generating a pin placement schema;

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for automating pin placement in injection molding processes. In an embodiment, a rule-based engine may be employed to determine desired pin configurations based on the geometry and features of the part to be molded.

Aspects of the present disclosure can be used to enhance the quality and consistency of molded parts. Aspects of the present disclosure can also be used to reduce manual interventions in pin placement. This is so, at least in part, because the apparatus is configured to generate a pin placement schema based on plurality of desired pin placement configurations.

Aspects of the present disclosure allow for increased efficiency in the molding process. Exemplary embodiments illustrating aspects of the present disclosure are described below in the context of several specific examples related to pin placement configurations.

Figure 1:
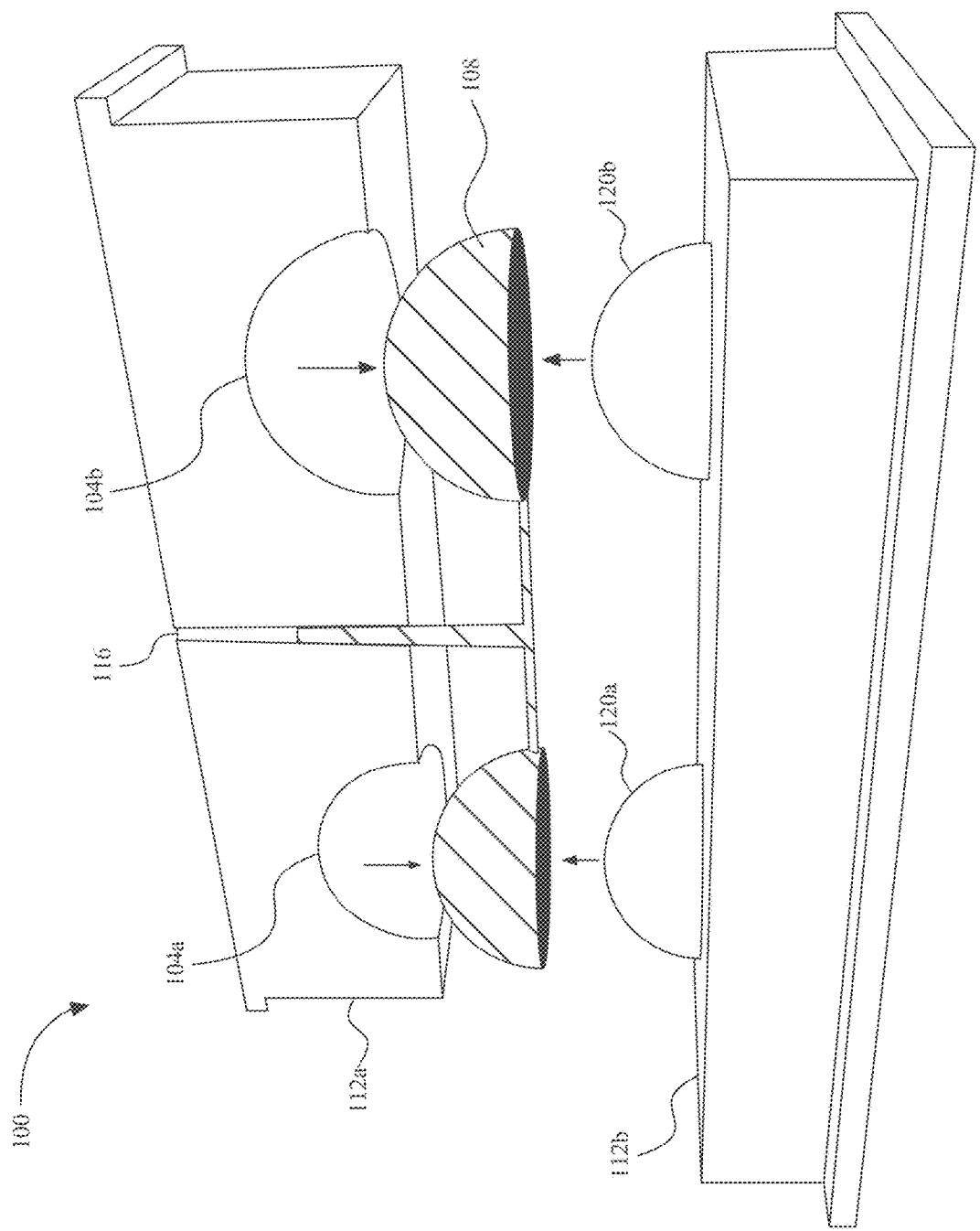
FIG. 1 is an exemplary embodiment of an injection molding.

Now referring to FIG. 1, an exemplary embodiment of an injection molding system 100 is illustrated. As used in this disclosure, "injection molding" is a manufacturing process that involves melting material (e.g., plastic) and injecting it into one or more mold cavities 104a-b to produce parts 108. Injection molding may be used to produce parts in large volumes. In a non-limiting example, once inside a mold, the material cools and solidifies to the shape of the cavity, thereby forming the desired part. After the material has solidified, the mold opens, and the part is ejected.

Still referring to FIG. 1, as described herein, a "mold" refers to a tool used in the injection molding process to shape the injected material as it cools and solidifies. In some embodiments, the mold may include a plurality of components that come together to form the desired shape of the part. In some cases, during injection molding, a plurality of components may be actuated by a cam action mechanism as described in detail below. For example, mold may include a stationary half 112a and a moving half 112b, which come together during the molding process.

Still referring to FIG. 1, in some cases, stationary half 112a may include one or more mold cavities 104a-b, wherein the "mold cavities," as described herein, are hollow spaces that define the shape of part 108 being molded. Moving half 112b, may include one or more cores, which is "mold core". In some cases, the molten material may be injected into these cavities through a "sprue" 116, which is a channel through which the molten material is introduced into the mold. In some cases, stationary half having one or more mold cavities 104a-b may also include sprue 116. On the other hand, moving half 112b may include one or more cores 120a-b, wherein the "cores," as described herein, are protruding features that create recesses or holes in the molded part 108. In some cases, the number of cores 120a-b on moving half 112b may match with the number of mold cavities 104a-b on stationary half 112a to ensure proper alignment and accurate part formation.

Still referring to FIG. 1, in a non-limiting example, stationary half 112a may securely close by the moving half 112b, ensuring that there are no gaps or spaces where the molten material can escape. In some cases, one or more male alignment features (not shown) on stationary half 112a may fit into corresponding female alignment features on moving half 112b, ensuring precise alignment during the molding process as described herein. Further, after the injection and cooling phases, the stationary half 112a may be opened, allowing for the finished part 108 to be removed. In some cases, this may be done automatically using one or more pins facilitated by cam action mechanism as described in detail below with reference to FIGS. 2A-D.

Still referencing FIG. 1, in some cases, molded part 108 may adhere or stick to the mold. This retention may be attributed to a grabbing effect resulting from the shrinking of material as it cools and solidifies within mold cavities 104a-b or a material interaction between the plastic of the part and metal of the mold. In some cases, as molten material contracts, it may create a vacuum or suction effect, causing part 108 to cling tightly to mold surface 120a and 120b, especially if there are intricate details or not enough draft angle in the design of part 108. Additionally, or alternatively, one or more factors such as, without limitation, type of material used, material cooling rate, surface finish, and/or the like of the mold may exacerbate the sticking phenomenon as described herein. To counteract this, plurality of pins such as ejector pins may be employed as described below to apply a uniform force to part 108 for a smooth part ejection from the mold.

Now referring to FIGS. 2A-D, an exemplary embodiment of an injection molding workflow 200 utilizing a plurality of pins is illustrated. As used in this disclosure, a "pin," also known as "ejector pin," is a cylindrical component that is used to push the molded part 108 out of the mold after the part has cooled and solidified. In some cases, plurality of pins such as plurality of ejector pins 204 may be controlled by an ejector system in an injection molding apparatus 208. In some cases, plurality of pins may be actuated and/or activated during an ejection phase of the molding cycle.

Figure 2B:
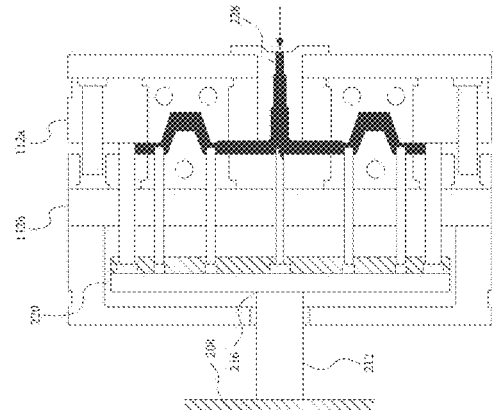
FIGS. 2A-D illustrate an exemplary embodiment workflow utilizing a plurality of pins.
Figure 2D:
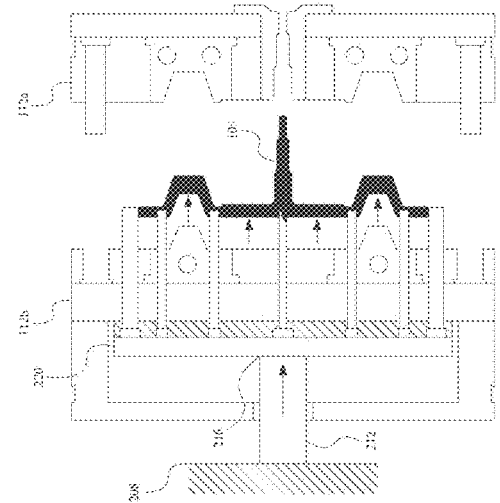
Figure 2A:
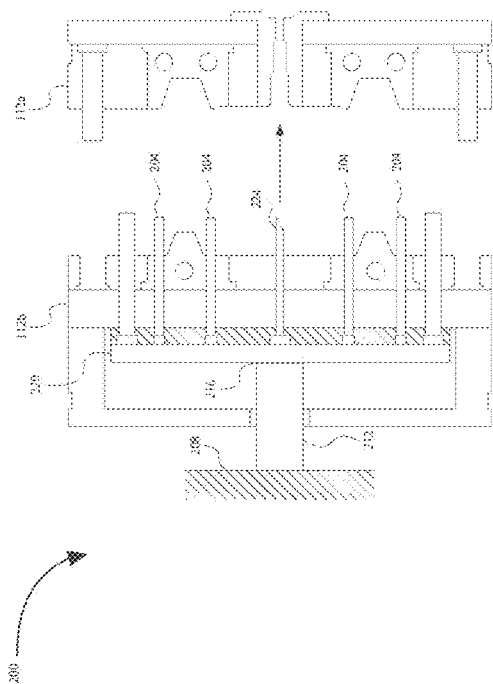
Figure 2C:
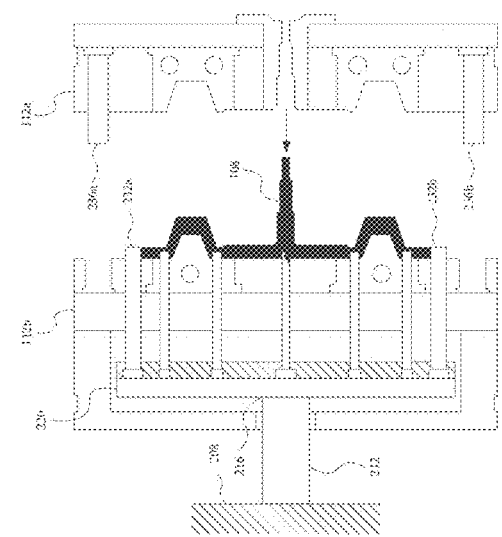

Still referring to FIGS. 2A-D, in some cases, an injection molding apparatus 208 may include a cam action mechanism 212 mechanically connected to at least two mold halves e.g., stationary half 112a and moving half 112b. As used in this disclosure, an "cam action mechanism" is a device or assembly that facilitates the movement, alignment, or positioning of the at least two mold halves during the injection molding process as described herein. In some cases, the stationary half 112a including one or more mold cavities 104a-b may be configured at a fixed position, anchoring the mold structure, while moving half 112b may be connected to cam action mechanism 212 through a mechanical interface 216, wherein the mechanical interface 216 may be in contact with at least a movable platen (e.g., pin stage as described below) that ensure efficiently translate the clamping and opening force from connected opening mechanism 112b in a synchronized manner. In these cases, mechanical interface 216 may precisely move moving half 112b away from stationary half 112a, transitioning the mold to an open state (as shown in FIG. 2A and FIGS. 2C-D), or towards stationary half 112a to transition to a closed state (as shown in FIG. 2B), ensuring a tight seal between the two halves. In some cases, at least two mold halves may be initially at closed state. At least two mold halves may remain at closed state during the molten material injection. In a non-limiting example, mechanical interface 216 as described herein may include an ejector bar.

Still referring to FIGS. 2A-D, in some cases, injection molding apparatus may include a pin stage 220, wherein the "pin stage," also known as an ejector plate, for the purpose of this disclosure, refers to a specialized platform or assembly designed to hold, position, and actuate the ejector pins during the molding process. In some cases, pin stage 220 may be mechanically attached to ejector bar. In other instances, pin stage 220 may be seamlessly integrated with the ejector bar 212, functioning as a single cohesive component. In an embodiment, a plurality of ejector pins 204 may be strategically disposed on the pin stage 220 according to a particular pin placement. In some cases, plurality of ejector pins 204 may be spaced out at either a constant or variable distance, depending on the specification, design requirements and the geometry of part 108 being molded. In some cases, pin stage 220 may be configured to evenly distribute the force applied by cam action mechanism 212 across plurality of ejector pins 204, allowing a uniform ejection force and a synchronized ejection movement. In a non-limiting example, when pin stage 220 is actuated, plurality of ejector pins 204 may move forward in a synchronized manner, to push part 108 off the mold core 120a-b and/or out of the mold cavities 104a-b as shown in FIGS. 2C-D.

With continued reference to FIGS. 2A-D, in some embodiments, plurality of pins may also include a sprue puller 224. As used in this disclosure, a "sprue puller" is a specialized type of ejector pin designed specifically to aid in the removal of sprue 116 (i.e., initial segment of molten plastic that fills the mold's feed as described above with reference to FIG. 1). In some cases, sprue puller 224 may be tapered or configured with a hooked end which allows sprue puller to securely grip the sprue 116 during the ejection phase to completely remove sprue 116 from a mold's sprue channel 228. In some cases, sprue puller may be mechanically attached to pin stage 220, for example, and without limitation, at the center of pin stage 220, below the mold's sprue channel 228.

Still referring to FIGS. 2A-D, in some cases, after part 108 is ejected, pin stage 220 with plurality of pins such as plurality of ejector pins 204 attached, including sprue puller 224, may be retracted, allowing the mold to close for the next cycle. In a non-limiting example, plurality of pins may also include one or more return pins 232a-b, wherein the "return pins," as described herein, are pins designed to ensure a retraction or return of the ejector system to its original position after the ejection process. In some cases, unlike standard ejector pins which primarily push the molded part 108 out of the mold, return pins 232a-b may function to reset ejector plate and associated pins back to their starting position, readying them for the next molding cycle. In a non-limiting example, return pins 232a-b may work in tandem with one or more springs or even hydraulic systems, which provide necessary force to pull pin stage 220 back. In some cases, return pins 232a-b may be installed proximal to the edge of pin stage 220. In some cases, return pins 232a-b may have a relatively larger diameter compared to other pins as described herein.

Still referring to FIGS. 2A-D, in one or more embodiments, plurality of pins may further include one or more lead pins 236a-b. As used in this disclosure, "lead pins" are pins designed to initiate ejection process ahead of plurality of ejector pins 204 as described above. In a non-limiting example, lead pins 236a-b may be configured to provide an initial (gentle) push to the molded part 108. In some cases, lead pins 236a-b may allow molded part 108 to begin the separation from the mold surface uniformly and without causing any damage or deformation. In some cases, lead pins 236a-b may be positioned at a proximal end and a distal end of stationary half 112a. In other cases, lead pins 236 may be placed on pin stage 220 at locations near areas of the molded part 108 that are more prone to sticking or where a more delicate ejection is required. As a person skilled in the art, upon reviewing the entirety of this disclosure, will be aware of various pins may be employed by injection molding apparatus 208 to facilitating part ejection during injection molding process.

Figure 3:
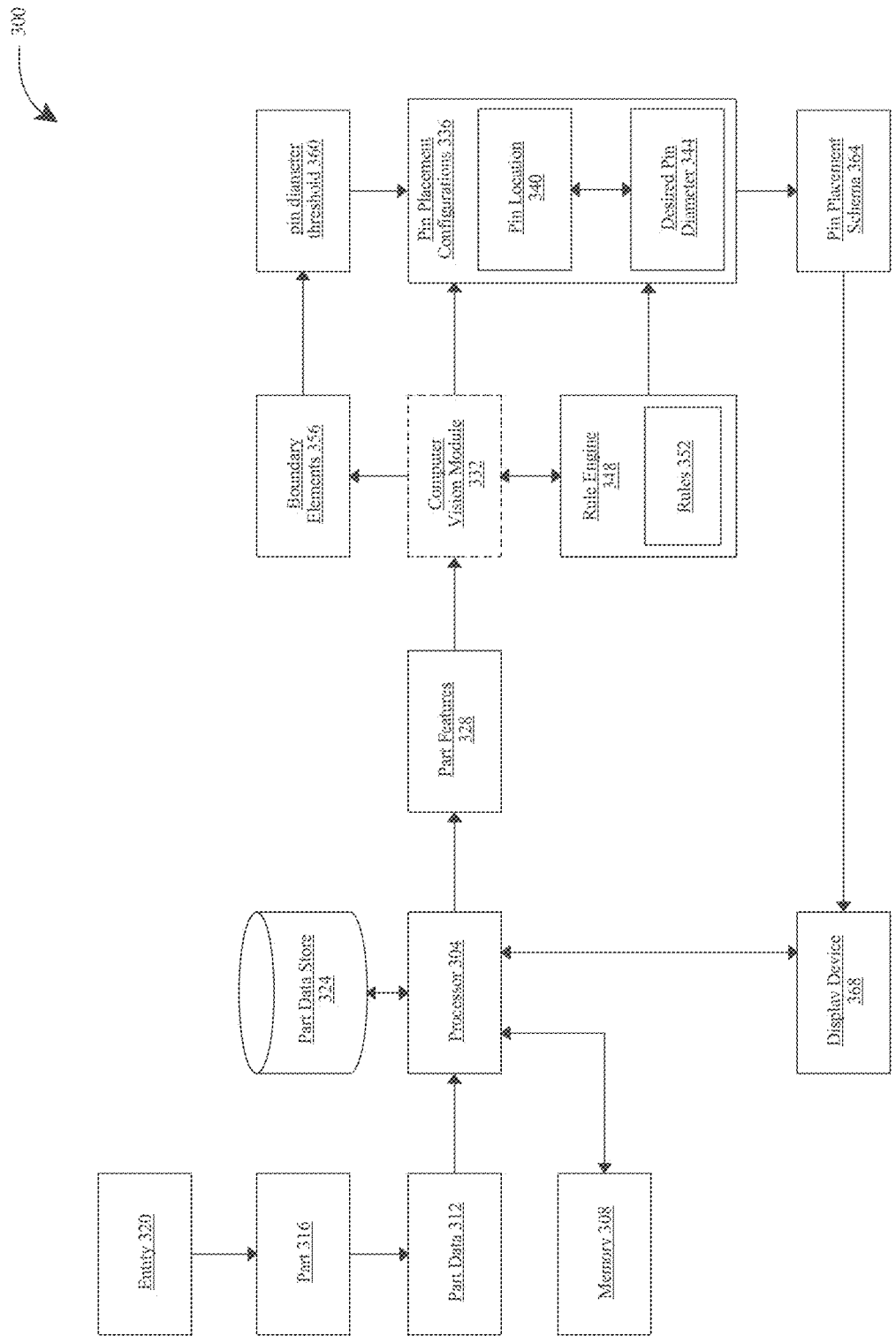
FIG. 3 is an exemplary embodiment of an apparatus for automatic pin placement in injection molding.

Now referring to FIG. 3, an exemplary embodiment of an apparatus 300 for automatic pin placement in injection molding is illustrated. As described herein, "pin placement" refers to strategic positioning of (ejector) pins within the mold. In some cases, proper pin placement may ensure that the molded parts have or remain the desired features in the correct locations and dimensions during the ejection phase of the part. In some cases, proper placement of ejector pins may ensure that the molded part can be smoothly and efficiently ejected from the mold without sticking or getting damaged. In a non-limiting example, if one or more ejector pins are not correctly placed, misplaced ejector pins may apply an uneven force on the part during ejection, potentially leading to warpage, deformation or breakage of the part. Additionally, or alternatively, while ejector pins may leave small marks on the molded parts, strategic placement of pins may ensure these marks are in non-critical or less visible areas of the part. In other cases, proper placement and usage of ejector pins may also reduce wear and tear on the produced mold, thereby extending its operational life. In some cases, apparatus 300 may include an injection molding apparatus as described above with reference to FIGS. 2A-D.

With continued reference to FIG. 3, apparatus 300 includes a processor 304. Processor 304 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Processor 304 may include a single computing device operating independently, or may include two or more computing device operating in concert, in parallel, sequentially or the like; two or more computing devices may be included together in a single computing device or in two or more computing devices. Processor 304 may interface or communicate with one or more additional devices as described below in further detail via a network interface device. Network interface device may be utilized for connecting processor 304 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 304 may include but is not limited to, for example, a computing device or cluster of computing devices in a first location and a second computing device or cluster of computing devices in a second location. Processor 304 may include one or more computing devices dedicated to data storage, security, distribution of traffic for load balancing, and the like. Processor 304 may distribute one or more computing tasks as described below across a plurality of computing devices of computing device, which may operate in parallel, in series, redundantly, or in any other manner used for distribution of tasks or memory between computing devices. Processor 304 may be implemented using a "shared nothing" architecture in which data is cached at the worker, in an embodiment, this may enable scalability of system 100 and/or computing device.

With continued reference to FIG. 3, processor 304 may be designed and/or configured to perform any method, method step, or sequence of method steps in any embodiment described in this disclosure, in any order and with any degree of repetition. For instance, processor 304 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 304 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 3, apparatus 300 includes a memory 308 communicatively connected to processor 304, wherein the memory contains instructions configuring processor 304 to perform any processing steps as described in this disclosure. As used in this disclosure, "communicatively connected" means connected by way of a connection, attachment, or linkage between two or more related which allows for reception and/or transmittance of information therebetween. For example, and without limitation, this connection may be wired or wireless, direct, or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio, and microwave data and/or signals, combinations thereof, and the like, among others. A communicative connection may be achieved, for example and without limitation, through wired or wireless electronic, digital, or analog, communication, either directly or by way of one or more intervening devices or components. Further, communicative connection may include electrically coupling or connecting at least an output of one device, component, or circuit to at least an input of another device, component, or circuit. For example, and without limitation, using a bus or other facility for intercommunication between elements of a processor 304. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 3, processor 304 may perform determinations, classification, and/or analysis steps, methods, processes, or the like for the purposes of this disclosure using machine-learning processes. A "machine-learning process," as used in this disclosure, is a process that automatedly uses a body of data known as "training data" and/or a "training set" (described further below in this disclosure) to generate an algorithm that will be performed by processor 304 to produce outputs given data provided as inputs; this is in contrast to a non-machine learning software program where the commands to be executed are determined in advance by a user and written in a programming language. A machine-learning process may utilize supervised, unsupervised, lazy-learning processes and/or neural networks, described further below.

With continued reference to FIG. 3, processor 304 is configured to receive part data 312, the part data 312 corresponding to a part 316, from an entity 320. "Part data" as used herein is defined as an element or elements of information related to part 312. "Data" as used herein, may mean plural elements of information or a single element of information. An "entity," as used herein, means anyone or anything that might provide information, including a person, group of people, company, corporation, business, juristic entity, computer program, user, database, AI, algorithm, mathematical model, and the like. In some cases, part data 312 may specify parameters defining part 316 including, without limitation, design specifications, dimensions, material requirements, tolerances, and any other critical details necessary to accurately manufacture and/or delivery part 316.

Still referring to FIG. 3, a "part," for the purpose of this disclosure, refers to a distinct piece or component of a larger system, assembly, or otherwise a structure. In some embodiments, part 316 may denote any individual element that contributes to the whole. In a non-limiting example, under the context of manufacturing and engineering, part 316 may include a single piece used in the assembly of a product or machinery. In some cases, part 316 may be manufactured from various materials, including, for example and without limitation, aluminum, steel, titanium, metal alloys, brass, and the like; plastics, such as nylon, acrylic, ABS, Delrin, polycarbonate, and the like; foam, composites, wood, etc. or other substances. In some cases, part 316 may have one or more specific functions or role within the assembled item. In some cases, part 316 may be manufactured using injection molding as described herein.

Still referring to FIG. 3, in one or more embodiments, part data 312 includes a part model of part 316. A "part model," as used in this disclosure, is a description, illustration, two-dimensional model, three-dimensional model, computer-aided design (CAD) model, CAD drawing, computer-aided machining (CAM) model, engineering drawing, sketch, group of dimensions, surface mesh, coordinates, or anything that shows or otherwise defines a part. In some cases, part 316 may be created by any manufacturing process other than injection molding, for example, without limitation, additive manufacturing or subtractive manufacturing. In some cases, part data 312 may include a print. In a non-limiting example, part data 312 may include a print having tolerance data indicating one or more manufacturing tolerances required for dimensions defining part 316. In an exemplary embodiment, part data 312 may include one or more of a three-dimensional (3D) computer-aided design (CAD) model of part 316, a two-dimensional (2D) engineering drawing of the part, a bill of materials, a material specification for the part, and other information relating to part 108.

Still referring to FIG. 3, as used in this disclosure, "two-dimensional" means having, appearing to have, or displaying two out of the three dimensions of length, width, and height. As used in this disclosure, "three-dimensional" means having, appearing to have, or displaying all three out of the three dimensions of length, width, and height. As used herein, a "print" is defined as any 2D depiction of part 108. Such 2D prints may include any data describing the part 316 such as dimensions and tolerances. In a non-limiting example, for a given part such as an automotive brake disk, wherein part data 312 of the automotive brake disk may include a list (or any other suitable data structure for storing a collection of data e.g., vector array, dictionary, hash tables/maps, and/or the like) of key value pairs such as, "Material: Cast Iron," "Diameter 280 mm," "Thickness: 25 mm," "Number of Bolt Holes: 5," "Bolt Circle Diameter: 114.3," "Tolerance: ±5 mm," "Weight: 6.2 kg," and the like.

With continued reference to FIG. 3, in some embodiments, part data 312 may include a set of part images, representing different 2D views of a 3D CAD model of part 316. In some cases, each part image may include a print as described above. In some cases, part images may be generated by projecting 3D CAD model onto a 2D plane from different orientations, capturing the intricate details and contours of part 316 from multiple perspectives. In a non-limiting example, part data 312 may include a plurality of part images of part 316, wherein the plurality of part images include at least one part image illustrating a front view (i.e., a straight-on view) of part 316 (from the front), at least one part image illustrating a side view (i.e., view from both right and left side) of part 316, at least one part image illustrating a top view (i.e., bird's-eye view), and at least one part image illustrating a bottom view (i.e., worm's-eye view). In some cases, plurality of part images may also include one or more isometric views, wherein the isometric views may be taken from angles that show part 316 in a 3D perspective such as, without limitation, top-right, top-left, bottom-right, and bottom-left angles. In some cases, plurality of part images may further include one or more sectional views such as sectional or cut-away views of part 316.

Still referring to FIG. 3, additionally, or alternatively, part data 312 may include information derived from one or more-part images. In some cases, part data 312 may include data describing an overall layout, footprint, dept, profile, features, fine details, and/or the like of part 316. In these cases, part data 312 may be received from one or more CAD software tools that automatically generate part images as described herein. Once generated, part images may be annotated with dimensions, labels, and other pertinent part data 312. In some cases, part data 312 may be correlated with plurality of part images, forming a visual dataset. In other cases, part data 312 may be derived by analyzing plurality of part images using one or more image processing or computer vision techniques, including one or more machine learning processes as described in detail below. As a person skilled in the art, upon reviewing the entirety of this disclosure, will be aware of various part data 312 may be received by apparatus 300.

With continued reference to FIG. 3, in some cases, part data 312 may be received from a part data store 324 e.g., a database. In some cases, part data store 324 may be implemented, without limitation, as a relational database, a key-value retrieval database such as a NOSQL database, or any other format or structure for use as a database that a person skilled in the art would recognize as suitable upon review of the entirety of this disclosure. Part data store 324 may alternatively or additionally be implemented using a distributed data storage protocol and/or data structure, such as a distributed hash table or the like. Part data store 324 may include a plurality of data entries and/or records as described above. Data entries in part data store 324 may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a part data store 324 may store, retrieve, organize, and/or reflect data and/or records as used herein, as well as categories and/or populations of data consistently with this disclosure.

With continued reference to FIG. 3, processor 304 is configured to identify a set of part features 328 as a function of part data 312. As used in this disclosure, a "set of part features" refers to a collection of "part features," wherein the "part features" are attributes, characteristics, or elements that define or describe part 316. In some cases, set of part features 328 may include one or more geometrical features that relate to the shape, size, and spatial orientation of part. In a non-limiting example, such part features may include slots, holes, ribs, chamfers, fillets, bosses, grooves, corners, and the like. In some cases, set of part features 328 may include one or more material-based features, for example, features pertaining to material properties of part 316, such as, without limitation, material hardness, tensile strength, thermal conductivity, and the like. In other cases, set of part features 328 may include one or more surface features such as, without limitation, features related to surface finish, texture, or treatment of part 316; for instance, and without limitation, such part features may include part surface polishing, knurling, coating, and/or the like.

With continued reference to FIG. 3, in some embodiments, identifying set of part features 328 may include scanning (i.e., interpreting and analyzing), by processor 304, at least one CAD model and extracting plurality of part features based on the scan. In an embodiment, processor 304 may be configured to analyze geometric and topological data embedded within the CAD model. Such data may be incorporated within part data 312 as described above. In a non-limiting example, processor 304 may import CAD model (in a digital file format e.g., .dwg, .dxf, .step, or the like) and extract geometric and topological data related to part 316 by decoding the file's binary or ASCII data. In some cases, processor 304 may utilize one or more specialized algorithms to interpret parametric and/or non-parametric data representations within the model. In a non-limiting example, upon scanning, processor 304 may identify distinct geometrical entities such as vertices, edges, faces, and solids through algorithms such as, boundary representation (B-Rep), constructive solid geometry (CSG), non-uniform rational B-Splines (NURBS). Delaunay triangulation & Voronoi Diagrams, marching cubes algorithm, quadtree 2D and Octree 3D decomposition, and/or the like. In some cases, identified geometrical entities may be then categorized based on their geometric characteristics, for example, planar or curved surfaces, linear or non-linear edges, simple or complex vertices, among others. In some cases, processor 304 may also be configured to retrieve attributes associated with CAD model such as, without limitation, material properties, tolerances, surface finishes, among others. In some cases, this may be implemented using one or more machine learning models, such as one or more classifiers as described in detail below with reference to FIG. 11. Processor 304 may organize identified set of part features 328 and/or extract information into a structure format, for example, and without limitation, a feature tree or a hierarchical data representation.

Still referring to FIG. 3, in some embodiments, identifying set of part features 328 may also include recognizing patterns, symmetries, and repetitions within 3D CAD model. In some cases, processor 304 may be configured to perform a feature recognition algorithm to identify and classify plurality of part features such as, without limitation, one or more geometric features such as holes, pockets, bosses, filets, and/or the like as described above. Additionally, plurality of part features may include primitive features such as cylinders, spheres, prisms, and/or the like. In a non-limiting example, processor 304 may utilized one or more graph-based methods to identify set of part features 328 by representing part 316 as a graph, wherein the graph may include a plurality of nodes representing faces and edges represent adjacency relationships between faces. In some cases, recognizing one or more part feature may include finding a subgraph that matches a predefined feature graph. In other cases, processor 304 may decompose volume of part 316 into a plurality of simpler volumes, wherein intersection of the plurality of simpler volumes may represent one or more-part features.

With continued reference to FIG. 3, in some cases, identifying set of part features 328 may involve one or more machine learning processes. Processor 304 may scan at least one 3D CAD model using a computer vision module 332. As used in this disclosure, a "computer vision module" is a component configured to perform one or more computer vision tasks. "Computer vision," as used in this disclosure is defined as a field of artificial intelligence (AI) enabling computing device to derive information from visual data such as images and/or videos. In some cases, computer vision tasks e.g., feature extraction, image/video interpretation, and/or image/video analysis may be performed on set of part images as described above. In an embodiment, computer vision module 332 may be configured to receive plurality of 2D prints or 2D drawings of part 316. In some cases, computer vision module 332 may also take 3D model of part 316 as input. In a non-limiting example, computer vision module 332 may include a (3D) convolutional neural networks (CNNs) trained on part data 312 such as labeled CAD data to recognize plurality of part features as described herein. In some cases, labeled CAD data may include a plurality of CAD models as input correlated to a plurality of feature sets as output. In some cases, such labeled CAD data may be received from data store 324 or from one or more user inputs made by entity 320.

With continued reference to FIG. 3, additionally, or alternatively, in some cases, identifying set of part features 328 may include assign a weight to each part feature of plurality of part features and identifying set of part features 328 by ranking plurality of part features as a function of the associated weights. In an embodiment, processor 304 may be configured to determine a priority of pin placement of part 316. In a non-limiting example, weights may be determined by processor 304, based on multiple features e.g., 1) pin on ribs and 2) pin on floor. In some instances, part feature such as ribs may be given a higher priority due to their structural significance and potential challenges associated with manufacturing and assembly processes of corresponding part 316. In some cases, ranking of plurality of part features may be as follows: 1) intersections, 2) boss, 3) corners, 4) ends, 5) interval, 6) floor, and 7) holes. In some cases, ranking of plurality of features may be pre-determined based on a predefined set of criteria or weights. In some cases, weights may be sourced from part data store 324. Part data store 324 may be populated based on historical data, expert input, or industry best practices. In other cases, ranking of plurality of features may be derived from user preferences or user feedback, wherein the entity 320 may have option to adjust or prioritize certain part features based on specific requirements or professional experiences. In a non-limiting example, weights may be calculated, and plurality of features may be ranked according to a plurality of rules using a rule-based engine as described in further detail below. It should be noted that the aforementioned rankings are merely illustrative and represent a potential ranking for plurality of part features.

With continued reference to FIG. 3, in some cases, processor 304 may determine one or more alternative rankings based on different situations, specific design considerations, and user needs. In some cases, apparatus 300 may employ one or more machine learning algorithms that have been trained on training data containing dataset describing previous pin placement scenarios, part design variations, user feedbacks, and/or the like. In some cases, processor 304 may be configured to use different set of weights, wherein the decision on which set of weights to user may be based on various factors including, without limitation, context of part design e.g., complexity of part 316, its functionality or intended use, materials involved, and/or the like. In some cases, processor 304 may be configured to utilize multiple predefined weight sets for different common pin placement scenarios or parts. In a non-limiting example, when a new part is introduced, and plurality of part features are identified, processor 304 may compare newly identified part features against the previously identified part features and select at least a set of weights that aligns most closely with historical part features. Additionally, or alternatively, processor 304 may determine set of weights as a function of a user profile; for instance, and without limitation, if entity has consistently preferred certain feature priority in the past, processor 304 may prioritize those features in the future. It should be noted that the provided ranking should not be construed as limiting the scope of this disclosure. As a person skilled in the art, upon reviewing the entirety of this disclosure, will recognize apparatus 300 as described herein may be adaptable, therefore may accommodate various ranking algorithms tailored to unique requirements of different applications.

With continued reference to FIG. 3, processor 304 is configured to determine a plurality of pin placement configurations 336. As used in this disclosure, "pin placement configurations" refers to specific parameters and attributes associated with positioning and design of pins. In some cases, pin placement configurations 336 may affect structural integrity, functionality, and/or manufacturability of part 316 as described herein. In some embodiments, plurality of pin placement configurations 336 may include one or more pin diameter i.e., the thickness or width of the pin. In some cases, a larger diameter pin may be used in areas requiring greater support, while a smaller diameter pin may be used in areas with space constraints or less structural demand. In some embodiments, plurality of pin placement configurations 336 may also include one or more pin locations i.e., the specific point or area on part 316 wherein the pin is placed. In some cases, pin location may include a coordinate e.g., (x, y) on a part surface in a XY plane. In other cases, pin location may include a (spatial) coordinate such as (x, y, z) at a specific location of 3D CAD model in a 3D space. In some instances, pins may be located at stress points on part 316 to provide support. In other instances, pins may be spaced evenly across a surface for uniform distribution of force.

Still referring to FIG. 3, in some embodiments, pin placement configurations 336 may include one or more placement patterns (i.e., specific arrangements, orientations, and positions) in which pins are placed on or within part 316). In some cases, placement patterns may include a linear configuration, wherein plurality of pins may be placed in a straight line, equidistant from each other, across a specific feature or surface of part 316; for instance, and without limitation, on a long, flat surface of a rectangular part, plurality pins may be placed in a straight line from one end to the other. In some cases, placement patterns may include a radial configuration, wherein plurality of pins may be arranged in a circular pattern, radiating outwards from a central point or feature, for example, and without limitation, on a circular gear or wheel, pins may be placed in a radial configuration around central hub. In some cases, placement patterns may include a grid configuration, wherein plurality of pins may be placed in a grid-like pattern, with rows and columns of pins evenly spaced across a surface. In some cases, placement patterns may include a perimeter configuration, wherein plurality of pins may be placed along the edges or boundaries of a part or feature. As a person skilled in the art, upon reviewing the entirety of this disclosure, will be aware of various placement patterns described herein and other exemplary embodiments of placement patterns such as random configurations, clusters configurations, and/or the like that may be implemented by apparatus 300. It should be noted that more than one placement patterns as described herein may be combined to achieve desired outcomes. In a non-limiting example, on a part with both flat surfaces and curved edges, plurality of pins may be placed in a linear configuration on the flat surfaces and a radial configuration around the curved edges.

Still referring to FIG. 3, in a non-limiting example, determining the plurality of pin placement configurations 336 includes determining a plurality of pin locations 340 based on set of part features 328 and determine a desired pin diameter 344 at each pin location of the plurality of pin locations. In some cases, processor 304 may utilize a rule engine 348 for pin location determination. As used in this disclosure, a "rule engine," as described herein, refers to a computational system that uses a set of predefined rules 352 (or criteria) to make decisions based on input data, wherein each "rule" within the set of rules, for the purpose of this disclosure, is a specific criterion or condition that dictates where (and how) pins should be placed in relation to the identified part features. In some cases, set of part features 328 may be input into rule engine 348. Rule engine 348 may be configured to evaluate plurality of part features within set of part features 328 to determine desired pin locations. In some cases, set of predefined rules 352 may be based on structural requirements, manufacturing constraints, functional needs, or any combination thereof.

Still referring to FIG. 3, in some cases, pin locations 340 may be determined based on priority of part features (i.e., ranking) as described above, for example, and without limitation, pre-determined set of rules 352 may include one or more priority rule e.g., "pins should be placed before any other part features: corners>intersections>boss>>ends>intersections>rim>hole>pins." In some cases, set of part features 328 may include one or more combined features (i.e., complex part feature formed by multiple part features); For instance, and without limitation, pre-determined set of rules 352 may include a rule specifying "intersection of hex and rib takes priority over hex pin placement" In some cases, plurality of part features may be grouped and/or categorized at a surface level. In a non-limiting example, if pins don't fit on part surface, locations of these pins may be moved to next level surface e.g., floor. In some cases, one or more rules may be combined to determine plurality of pin locations 340. Continuing with the non-limiting example, a second rule such as "pins placed on along either edge of part floor is considered as perimeter pins," and a third rule such as "part should have a maximum of x number of perimeter pins" may be combined with the rule of dropping pins to next level if pins dimension out of bounds. Plurality of pin locations 340 may be determined and/or consolidate on secondary surface relative to primary surface. In this case, placing pins on floor may not be needed as the amount of perimeter pins (or previously determined locations of perimeter pins) may be sufficient. Maximum number of perimeter pins (i.e., third rule) may be exceeded or violated for such pin placement. Combination of rules is described in further detail below with reference to FIG. 10.

With continued reference to FIG. 3, in some cases, determining pin locations 340 may include determining pin spacings. For example, and without limitation, set of rules 352 may include one or more spacing rules. In some cases, pins may be evenly placed on or around part feature. In a non-limiting example, spacing rules may include a rule such as "if feature is a through hole, place pins x pins evenly around the through hole, wherein x is determined based on maximum allowable arc length y between pins. In other cases, plurality of pins may be placed as interval e.g., interval pins to maintain a minimum distance from each other. In some cases, minimum distance between each pin location may be determined based on user input from entity 320. In other cases, interval may be calculated by total displacement (or distance traveled) divided by number of pins that are allowed or currently available. In some cases, one or more spacing rules may include determining plurality of pin locations 340 based on pin size indicated by pin diameter 344 as described above.

Still referring to FIG. 3, in some cases, set of part features 328 may include one or more special features wherein conventional rules may not be suitable for determining desired pin locations using rule engine 348. In a non-limiting example, set of part features 328 may include an overhang feature at the center of part 316, wherein the overhang may be considered neither a rib nor a floor. In this case, plurality of pins may be biased towards one or more vertical walls of side of overhang. In another non-limiting example, part 316 may include a plurality of finger pins (i.e., lengths protrude from primary surface). In these cases, plurality of pins may be dropped on the floor, if and only if a distance A from a proximal end to a distal end of each finger pin is greater than a distance B from the distal end to the floor (i.e., A >B). In a further non-limiting example, when part 316 consists of a U shape feature, a plurality of pins may be placed according to end pin placement rule and pin locations of the plurality of pins may be aligned with the U shape feature i.e., the diameter of each pin is less or equal to the shallow D of said U shape feature.

With continued reference to FIG. 3, other exemplary embodiments of rules 352 may include orientation rules (e.g., the angle of the pin should align with primary force direction expected on part 316), material compatibility rule (e.g., pin material should be compatible with the material of part feature it is being placed one, to prevent issues such as corrosion or wear), functional rules (e.g., pins placed on functional feature such as holes or slots should not obstruct the primary functions of the that feature) As a person skilled in the art, upon reviewing the entirety of this disclosure, will be aware of various rules rule engine 348 may employ in determining plurality of pin placement configurations 336. In some cases, rule engine 348 may include an inference engine configured to evaluate set of pre-defined rules 352 against provided set of part features 328 and/or any other part data 312. Additionally, or alternatively, other pin placement configurations such as pin length, pin material, pin shape, pin surface finish, and/or the like may also be determined by processor 304 using rule engine 348 as described herein.

With continued reference to FIG. 3, in some embodiments, one or more machine learning models may be trained and configured to generate a desired set of pin locations 340 and/or corresponding pin diameters 344. Processor 304 may utilize a machine learning module to implement one or more algorithms or generate one or more machine learning models to determine plurality of pin placement configurations 336 as described above. However, the machine learning module is exemplary and may not be necessary to generate one or more machine learning models and perform any machine learning described herein. In one or more embodiments, one or more machine-learning models may be generated using training data. Training data may include inputs and corresponding predetermined outputs so that a machine-learning model may use correlations between the provided exemplary inputs and outputs to develop an algorithm and/or relationship that then allows machine-learning model to determine its own outputs for inputs. Training data may include finite element part ejection simulation, which predict sticking forces and simulate part breakage due to the ejection forces induced by the ejector pins. Training data may include finite element mold flow simulation, which simulate parts distortion and sticking. Training data may contain correlations that a machine-learning process may use to model relationships between two or more categories of data elements. Exemplary inputs and outputs may come from part data store 324 as described herein or any other databases, or even be provided by entity 320. In a non-limiting example, machine-learning module may obtain a training set by querying part data store 324 that includes past inputs and outputs. Training data may include inputs from various types of databases, resources, and/or user inputs and outputs correlated to each of those inputs so that a machine-learning model may determine an output. Correlations may indicate causative and/or predictive links between data, which may be modeled as relationships, such as mathematical relationships, by machine-learning models, as described in further detail below. In one or more embodiments, training data may be formatted and/or organized by categories of data elements by, for example, associating data elements with one or more descriptors corresponding to categories of data elements. As a non-limiting example, training data may include data entered in standardized forms by persons or processes, such that entry of a given data element in a given field in a form may be mapped to one or more descriptors of categories. Elements in training data may be linked to descriptors of categories by tags, tokens, or other data elements. In a further embodiment, training data may include previous outputs such that one or more machine learning models iteratively produces outputs.

Still referring to FIG. 3, in some cases, determining plurality of pin placement configurations 336 may include training a pin placement machine learning model using pin placement training data, wherein pin placement training data may include a plurality of part features as input correlated to a plurality of pin placement configurations as output. In some cases, pin placement training data may include a plurality of part data as input correlated to a plurality of pin placement configurations as output. In an embodiment, pin placement training data may include a plurality of CAD models, each correlated to a plurality of pin placement configurations. Processor 304 may then determine plurality of pin placement configurations 336 as a function of input data e.g., part data 312 and/or set of plurality of part features 328, using the trained pin placement machine learning model.

Still referring to FIG. 3, in some cases, determining plurality of pin placement configurations 336 may include training through finite element mechanical ejection simulation for trial pin placement. Poor pin placements are evaluated by finite element simulation (mechanical simulation) and scored negatively. For those successfully ejected by the mechanical simulation obtains higher score. With these scores of successful ejections, the machine learning algorithm train the optimum pin placement.

With continued reference to FIG. 3, in other embodiments processor 304 may be configured to identify a plurality of boundary elements 356 based on one or more adjacent part features at each pin location of plurality of pin locations 340. As used in this disclosure, "boundary elements" refers to discrete components or entities that define the outer limits or edges of a shape or structure. In some cases, boundary elements 356 may include, without limitation, points, lines, curves, or even surface, depending on the dimensionality of part 316. In one or more embodiments, plurality of boundary elements 356 may represent interfaces or transitions between different regions or part features of part 316. In some cases, identifying a plurality of boundary elements 356 may include iteratively identifying at least two vertices and at least one edge at each pin location of plurality of pin locations 340 based on proximal part features at each pin location of plurality of pin locations 340. As used in this disclosure, a "vertex" refers to a point where two or more lines or "edges" meet. In some cases, at least one edge may include a line segment connecting two vertices. In a non-limiting example, vertex may represent a corner or intersection in part 316. In 3D CAD model, vertex may include a point in 3D space defined by x, y, and z coordinates. In an embodiment, a pin location may be close to intersection of two adjacent features e.g., a rib and a boss. In such embodiment, boundary elements 356 at that pin location may include at least two vertices where the rib and boss meet and at least one edge of that define the intersection.

Still referring to FIG. 3, in some cases, plurality of boundary elements 356 may be used by processor 304 for determining pin diameter 344 as described above. In some cases, determining desired pin diameter 344 may include calculating a pin diameter threshold 360 as a function of plurality of boundary elements 356 and determining desired pin diameter 344 as a function of the calculated pin diameter threshold 360. In an embodiment, at least two vertices and at least one edge may dictate a diameter constraint e.g., a maximum diameter of a pin that can be placed without overlapping or interfering with adjacent features. If pin diameter goes beyond at least one edge or either one vertex of at least two vertices, the pin diameter may need to be reduced to prevent corresponding pin from protruding beyond at least one edge or interfering with adjacent features during ejection. In some cases, processor 304 may measure one or more distances between identified at least two vertices and at least one edges and calculate pin diameter threshold 360 as a function of the distances. In some cases, manufacturing tolerance may be taken into account to address potential errors, for example, a certain percentage e.g., 5% or 10% may be subtracted from calculated pin diameter threshold 360. Calculation of pin diameter threshold is described in further detail below with reference to FIGS. 4A-B.

Still referring to FIG. 3, in some cases, desired pin diameter 344 may be determined as part of optimizing pin placement based on adjacent part features, once pin diameter threshold 360 is established. In some cases, this may be done using rule engine 448 as described above. In a non-limiting example, if part 316 has intricate details or thin walls as part features, a smaller diameter may be chosen to reduce the risk of leaving marks or causing breakage and deformation, Conversely, for thicker or more stiff parts, pin diameter may be set closer to pin diameter threshold to ensure sufficient ejection force is provided. In other cases, desired pin diameter 344 may be determined by subtracting a pre-determined value. Such value may be determined based on adjacent part features. In some cases, a rule may state that "for every millimeter of wall thickness below a certain threshold, an additional 0.1 mm should be subtracted from pin diameter."

In some cases, another rule may consider proximity of pin location to features e.g., ribs, bosses, or holes, and adjusting pre-determined value accordingly. Additionally, or alternatively, additional factors e.g., material properties or both part and pins, expected cooling time, overall design of mold, may also be considered by processor 304 during desired pin diameter calculations. In some cases, processor 304 may reference one or more databases or lookup tables to factor in additional factors and determine and/or fine-tune desired pin diameter 344.

With continued reference to FIG. 3, in some embodiments, determining the desired pin diameter may also include refining desired pin diameter 344 as a function of plurality of additional boundary elements. In some cases, processor 304 may be configured to determine an initial pin diameter as a function of at least one boundary element of plurality of boundary elements 356 and determining the desired pin diameter by iteratively refining initial pin diameter as a function of the rest of plurality of boundary elements. In some cases, initial pin diameter may be the distance between at least two vertices. In a non-limiting example, when determining desired pin diameter at a detect corner represented by an inner vertex (i.e., outmost point of inner surface of part 316) and an outer vertex (i.e., an outer vertex (i.e., outmost point of outer surface of part 316); however, pin with initial pin diameter may be too large to accommodate the constraints of adjacent features e.g., edges on both sides of the outer vertex. In some cases, at each iteration, processor 304 may consider a new set of boundary elements 356 to adjust initial pin diameter. In a non-limiting example, processor 304 may be configured to utilize one or more optimization algorithms such as, gradient descent algorithm, genetic algorithm, simulated annealing, finite element analysis (FEA), constraint optimization, particle swarm optimization (PSO), response surface methodology (RSM), neural networks, and/or the like to refine desired pin diameter 344. In some cases, desired pin diameter 344 may be adjusted manually based on user input.

With continued reference to FIG. 3, in some cases, desired pin diameter 344 may be selected from a plurality of pins that are currently available. In a non-limiting example, processor 304 may be configured to query a connected database such as part data store 324 as described above or a pin lookup table (as illustrated below) to find at least one pin having a pin diameter that is closest to pin diameter threshold 360:

| PIN ID | PIN DIAMETER | PIN HEIGHT | PIN SPACING |
|--------|--------------|------------|-------------|
| 1 | 1.18872 | 6.35 | 12.7 |
| 2 | 1.5875 | 6.35 | 12.7 |
| 3 | 2.38252 | 6.35 | 15.875 |
| 4 | 3.175 | 6.35 | 19.05 |
| 5 | 6.35 | 11.1252 | 25.4 |
| 6 | 9.525 | 15.875 | 38.1 |
| 7 | 12.7 | 15.875 | 38.1 |

Each data entry within the pin lookup table may describe an available pin and associated specification (in columns) including, without limitation, pin diameter, pin height, pin spacing, and/or the like. In some cases, these measurements may include a uniform unit e.g., in millimeter (mm). In a non-limiting example, pin No. 1 may have a pin diameter of 1.18872 mm, a height of 6.35 mm, and a recommended spacing between two adjacent pins (when placed in the mold) of 12.7 mm. It should be noted that the above-listed pins and their specifications are provided solely for illustrative purposes and are not intendent to be exhaustive or limiting in any manner. The specific numbers, dimensions, and details mentioned in the above table are merely representative examples. Other columns such as, without limitation, material, maximum ejection force, manufacture, part number, and/or the like may also be included. As a person skilled in the art, upon reviewing the entirety of this disclosure, will be aware of various variations, modifications, and other specifications not explicitly mentioned herein may be contemplated in light of the current disclosure.

Still referring to FIG. 3, in some cases, pin placement configurations 336 may be updated based on additional rules. For instances, and without limitation, rule engine 348 may include additional rules that dictate the minimum distance between pins, the proximity to critical features of the part, or the allowable stress concentrations due to pin placement. In some cases, pin placement configurations 336 may be updated as injection molding process progress and as a function of real-time sensor data collected during the injection molding process. In one or more embodiments, sensor data related to parts breakage or ejection failure from production line and/or manufacturing simulations may be used by processor 304 to identify one or more adjustments to pin placement configurations 336. In some cases, a feedback loop may be established by fed updated pin placement configurations and corresponding part data 312, such as CAD models and/or part images, back to used machine learning models such as computer vision module 332, pin placement machine learning model, and the like. Processor 304 may enable these machine learning models to continuously learn from the updated training data, thereby allowing the system to remain adaptive and responsive to changes during injection molding process, leading to more efficient and accurate pin placements over time and further reduce the chances of part defects.

With continued reference to FIG. 3, processor 304 is configured to generate a pin placement schema 364 as a function of plurality of pin placement configurations 336. As used in this disclosure, a "pin placement schema" refers to a systematic representation or blueprint detailing the specific locations, orientations, and dimensions of plurality of pins e.g., ejector pins within a mold or tooling setup. In some cases, pin placement schema may be generated by combining plurality of pin placement configurations 336 with part data 312. In some cases, plurality of pin locations 340, each indicating where each pin of plurality of pins should be positioned within the mold, may be reflected on the corresponding side of 3D CAD model. Such reflection may also detail desired pin diameter, shape, and sometimes even the shape and length of each pin. In some cases, generating pin placement schema 364 may include generating associated metadata based on plurality of pin placement configurations 336. In a non-limiting example, pin placement schema 364 may include an illustration of force and moment distribution. In some cases, data on how the ejection force is distributed across pins and the moments on the part are balanced and corresponding regions of part 316 may be provided by pin placement schema 364 in addition to plurality of pin placement configurations 336. In some cases, one or more pin locations 340 or one or more subset of part feature set 328, for example, critical (i.e., high ranking) features or areas of part 316 that may influence the decision-making process of pin placement as described herein such as thin walls, ribs, bosses, and/or the like may be highlighted.

Still referring to FIG. 3, processor 104 is configured to integrate pin placement schema 364 into part model associated with part 316 as described above. In a non-limiting example, pin placement schema 364 for part 316 may be a detailed CAD diagram or at least a portion of the CAD diagram with plurality of pin locations and corresponding pin diameters projected on the surface of CAD model illustrated in the diagram. In some cases, these pin placement configurations 336 may be marked with colors (e.g., a red dot). In some cases, the size of each dot may correspond to the diameter of the pin, with larger dots indicating wider pins. In some cases, annotations (i.e., metadata) may be displayed next to each dot, configured to provide additional information, such as the exact coordinates, pin length, orientation, and/or the like. Injection molding apparatus and/or an operator may position plurality of pins on molding halves as described above with reference to FIGS. 1-2 according to the generated pin placement schema 364. Additionally, or alternatively, pin placement schema 364 may include one or more pin placement recommendations, wherein the "pin placement recommendations" are information related to specific locations, orientations, and configurations wherein pins should be placed to achieve desired molding results. In some cases, these recommendations may be based on various factors, including but not limited to, the geometry of the part 316, material used, cooling requirements, expected stresses during the molding process, and/or the like. In some cases, each pin placement recommendation may be accompanied by a rationale e.g., a reason of why a particular pin placement is suggested. In some cases, such rationale may be generated using generative machine learning as described below with reference to FIG. 11.

With continued reference to FIG. 3, during the integration of pin placement schema 364, processor 304 may be configured to implement pin placement schema 364 by placing a plurality of pins with desired pin diameters 344 at locations on an injection molding machine corresponding to plurality of pin locations 340, thereby ejecting the at least a part 316 using the plurality of pins upon a completion of the injection molding process without causing deformation to at least a part 316. In some cases, injection molding machine may include any injection molding apparatus as described above with reference to FIG. 2. In some cases, plurality of pins e.g., ejector pins, return pins, lead pins, and/or the like may be selected based on desired pin diameter 344 specified by pin placement schema 364. Implementing pin placement schema 364 may include physically placing plurality of selected pins onto specific locations on injection molding machine, for example, and without limitation, locations on pin stage as described above that correspond to plurality of pin locations 340 identified based on plurality of part features 328. In some cases, plurality of pins may be automatically positioned by injection molding machine at designated spots on the ejector plate, aligning with plurality of pin locations 340. In a non-limiting example, plurality of selected pins may be automatically inserted into the injection molding machine using one or more cam action mechanisms and/or mechanical interfaces as described above without any human intervention. In some embodiments, such strategic placement of pins, defined by pin placement schema 364, may ensure that the ejection process during the injection molding does not cause any deformation or damage to part 316, allowing a uniform pressure is applied across part's 316 surface.

With continued reference to FIG. 3, in some cases, pin placement schema 364 may be transmitted, by processor 304, to one or more display devices 368 communicatively connected to processor 304, for example, and without limitation, user devices having at least one display capable of presenting a graphical user interface (GUI) to end user e.g., entity 320. As used in this disclosure, a "display device" refers to an electronic device that visually presents information to the entity. In some cases, display device 368 may be configured to project or show visual content generated by computers, video devices, or other electronic mechanisms. In some cases, display devices may include, without limitation, a liquid crystal display (LCD), a cathode ray tube (CRT), a plasma display, a light emitting diode (LED) display, and any combinations thereof. In a non-limiting example, one or more display devices 368 may vary in size, resolution, technology, and functionality. Display device 368 may be able to show any data and/or visual elements described herein in various formats such as, textural, graphical, video among others, in either monochrome or color.

Still referring to FIG. 3, a "graphical user interface (GUI)," as used herein, is a graphical form of user interface that allows entity 320 to interact with apparatus 300. In some embodiments, GUI may include icons, menus, other visual indicators, or representations (graphics), audio indicators such as primary notation, and display information and related user controls. In one or more embodiments, GUI may serve as a primary medium through which one or more pin placement schemas 364 are presented to entity 320. In some cases, displaying pin placement schema 364 may also include a change in GUI, such as, without limitation, presentation of a new module, adjustment of content display, initiation of a feedback loop, and/or the like. For instance, and without limitation, when plurality of pin placement configurations 336 is determined, GUI may dynamically change current display e.g., 3D CAD model to display pin placement schema 364. In some cases, display may be overlayed, for example, pin placement schema 364 may be directly overlayed on 3D CAD model with plurality of pin locations 340 marked in color as described above. Additionally, or alternatively, GUI may be designed to capture user input or user feedback from entity 320 regarding the part data 312, plurality of pin placement configurations 336, pin placement schema 364, and/or the like. In a non-limiting example, part data 312 may be received from user devices through one or more interactions (i.e., user input) between entity 320 and GUI as described herein.

Figure 4A:
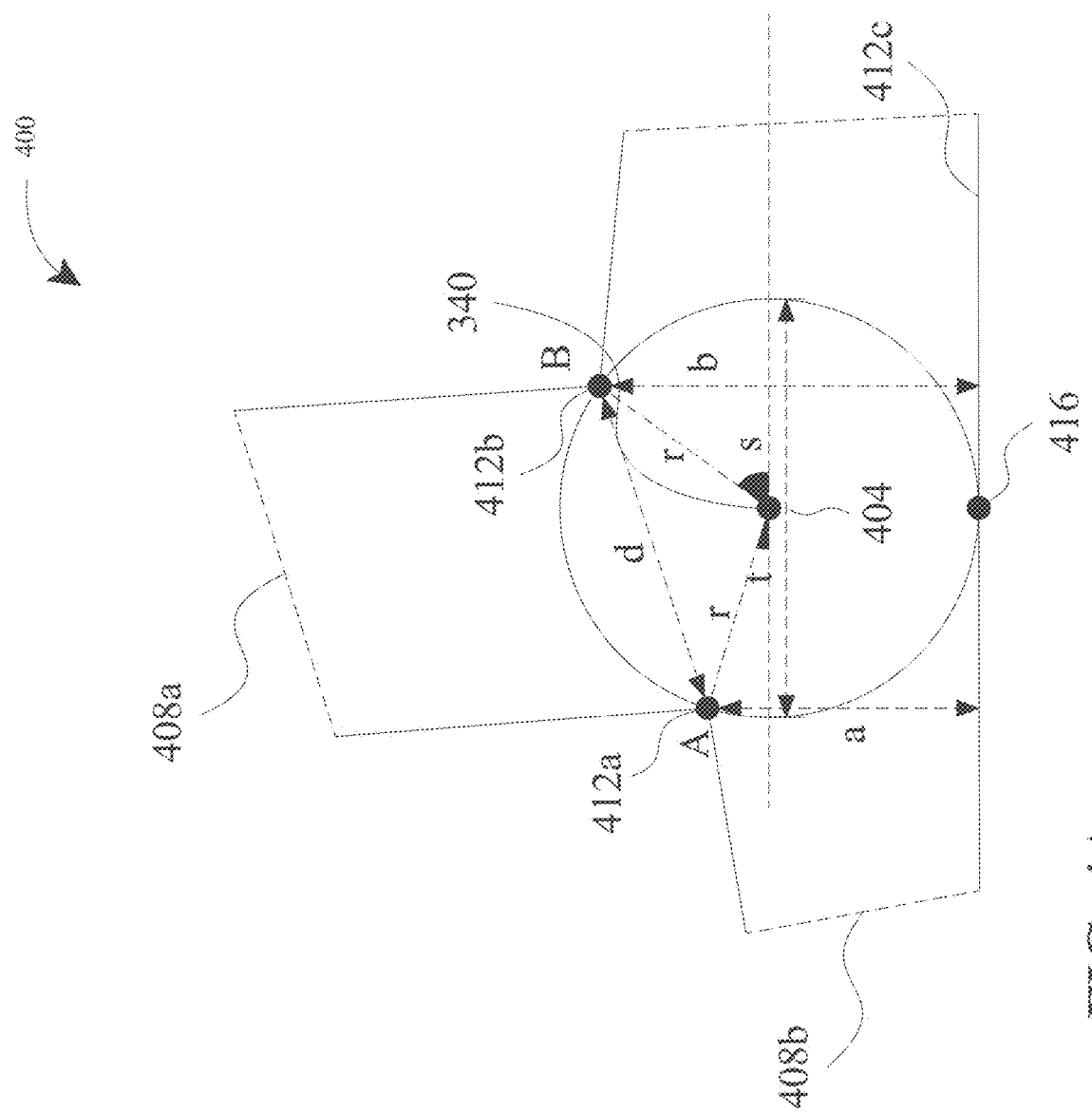
FIG. 4A is an exemplary embodiment of a geometric diagram for calculating pin diameter threshold at an intersection.

Now referring to FIG. 4A, an exemplary embodiment of a geometric diagram 400 for calculating pin diameter threshold 404 at an intersection is illustrated. Two structural elements of a given part, e.g., a first rib 408a and a second rib 408b as shown in FIG. 4A, may meet or cross each other. In some cases, calculating pin diameter threshold 404 may include identifying a plurality of boundary elements 412a-c as described above with reference to FIG. 3. Boundary elements 408a-c may be understood as defining geometric features that characterize the intersection's shape and orientation. In a non-limiting example, identified plurality of boundary elements 412a-c may include at least two vertices 412a-b and at least one edge 412c, wherein the at least two vertices 412a-b may be points where first rib 408a begins or ends at the intersection. In some cases, at least two vertices 412a-b may be at different sides, for example, first vertex 412a (A) may be a point on a first side of surface while second vertex 412b (B) may be a point on a second side of surface i.e., an opposite side of surface of the first side of surface. At least an edge 412c may include an edge of second rib 408b that is in proximity or directly involved in the intersection with first rib 408a.

Still referring to FIG. 4A, in some cases, pin diameter threshold 404 may include a maximum pin diameter of a pin placed at the described intersection. Such maximum pin diameter may be calculated using following mathematical model:

$$\begin{cases} a = r + r \cdot \cos(t) \\ b = r + r \cdot \cos(s) \\ d = r \cdot \sin(s) + r \cdot \sin(t) \end{cases} \text{solve } \{r, s, t\}$$

Where a is the shortest distance between first vertex 412*a* to at least an edge 412*c*, b is the shortest distance between second vertex 412*b* to at least an edge 412*c*, and d is the shortest distance between first vertex 412*a* to second vertex 412*b*. In some cases, coordinates of all plurality of boundary elements 412*a-c* may be know upon successful identification of plurality of boundary elements 412*a-c*; therefore, all three distance a, b, and d may be known to the processor. Calculating pin diameter threshold may further include identifying a pin location e.g., a focus based on identified plurality of boundary elements 412*a-c* and calculating a pin radius r, a first central angle s, and a second central angle t as shown in FIG. 4A.

Still referring to FIG. 4A, additionally, or alternatively, pin diameter threshold 404 may also be determined using Barycentric coordinates. In some cases, Barycentric coordinates may be employed to determine a relative position of a point i.e., pin location within a triangular region formed by at least two vertices 412*a-b* and at least a point 416 (C) on at least one edge 412*c* as follows:

$$a^2(b^2+c^2-a^2):b^2(c^2+a^2-b^2):C^2(a^2+b^2-c^2)$$

Where a, b, c is edge length between points A, B, and C i.e., BC, CA, AB respectively. Processor may determine how close or far the pin location is from each point; for instance, and without limitation, if Barycentric coordinate of pin location is heavily weighted towards first vertex 412*a*, it may indicate that the pin location is closer to first vertex 412*a* or vice versa.

Now referring to FIG. 4B, a series geometric diagrams demonstrating an alternative method for calculating pin diameter threshold 404 at an intersection is illustrated. In such an embodiment, the pin placement method may include computing a center (i.e., pin location 340) and the radius r of inscribed circle starting from an initial guess 420 then iteratively converging the initial guess 420 into a final output 424. In some cases, initial guess 420 may include a larger circle, for instance, and without limitation, a circle that may not be limited by identified vertices and/or edges. In a non-limiting example, pin placement method described herein may include a "geometric projection iterative method", which is, as used herein, a technique to compute the inscribed for general shapes. In one or more embodiments, geometric projection iterative method may be configured to start from initial guess 420 (e.g., a circle tangent to point A and B, as shown in the left-most geometric diagram in FIG. 4B, that encloses the area of the intersection). In some cases, closed form solutions or analytical solutions may be only available for limited cases, such as solution as shown in FIG. 4A. For general shapes, closed form solutions are not available. For those cases, geometric projection iterative method may be used to compute the inscribed circle.

Still referring to FIG. 4B, geometric projection iterative method may iteratively look for at least a point (A, B, or C) which is closest to a trial center P and calculate a distance between identified point, in this case, A' and the trail center P. The distance may be compared against the radius of the inscribed circle, and recompute the inscribed circle using, for example, A', B and C, which gives the inscribed circle at the cross section. In some cases, geometric projection iterative method as described herein may be not limited to straight lines, for example, the method may handle general curves such as, without limitation, arc, ellipse, spline, parabola, and/or the like.

Figure 5:
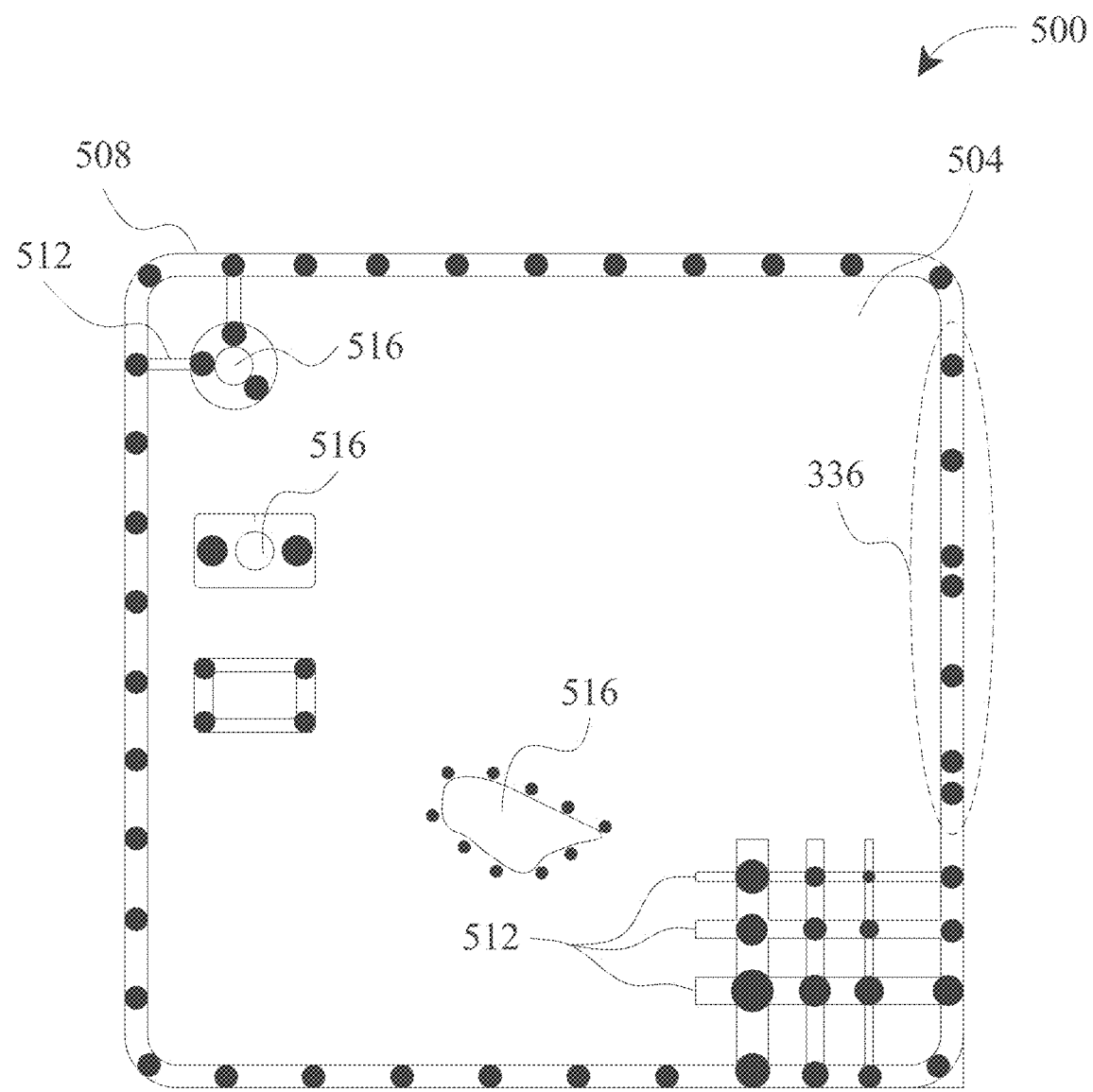
FIG. 5 shows an exemplary embodiment of a pin placement schema.

Now referring to FIG. 5, an exemplary embodiment of a pin placement schema 500 of a part is illustrated. In an embodiment, pin placement schema may include a 2D print e.g., top view of 3D CAD model 504 of a part with plurality of pin configuration parameters 336 e.g., pin locations 340 overlay on top of the print. In some cases, part may include a plurality of features such as, without limitation, rib 508, boss 512, hole 516, and/or the like. In a non-limiting example, pin locations 340 may be marked with color, aiding in quick visual identification at the display device. In some cases, the area of the mark may indicate a desired pin diameter e.g., a larger area may represent a pin with a larger diameter, while a smaller area may signify a pin with a smaller diameter. Additionally, or alternatively, pin placement schema 500 may incorporate different shapes or patterns for the marks as described above. For example, a circular mark may represent a steel pin, while a triangular marker may represent titanium nitride (TiN) coated pin.

Now referring to FIGS. 6A-D, an exemplary embodiment of a workflow 600 of generating a pin placement schema is illustrated. As shown in FIG. 6A, plurality of part features 604*a-f* may be identified and extracted from a part 608. In some cases, part features 604*a-f* may include one or more corners (604*a* and 604*c*), one or more intersections (604*b*, 604*d* and 604*e*), and snap-fit 604*f*. A plurality of pin locations (and plurality of boundary elements) may be determined, as shown in FIG. 6B, as a function of identified part features 604*a-f* using rule engine. In some cases, at least one pin may be placed at each pin location. In some cases, boundary elements may include any boundary elements as described above such as, without limitation, at least two vertices and at least one edge. A pin diameter threshold may then be determined, as shown in FIG. 6C, as a function of plurality of boundary elements at each pin location. Pin diameter threshold may include a maximum pin diameter of the pin at each pin location such that it does not interfere with adjacent features or structures, ensuring optimal ejection without causing damage to part 608. In a non-limiting example, pin diameter threshold may be calculated, using mathematical model and/or equations as described above with reference to FIGS. 4A-B. Further, as shown in FIG. 6D, a desired pin diameter may be determined based on calculated pin diameter threshold and pin placement schema may be generated. This may be implemented, without limitation, as described above with reference to FIGS. 3-5. For example, and without limitation, an initial guess circle may be positioned at each pin location of plurality of pin locations at the middle of at least two vertices, wherein the initial guess circle may be equivalent to pin diameter threshold. In some cases, such initial guess circle may be iteratively refined based on additional boundary elements e.g., additional vertices and edges to an interactive inscribed circle with desired pin diameter. This may be achieved by utilizing Barycentric coordinates as described above with reference to FIGS. 4A-B.

Figure 7:
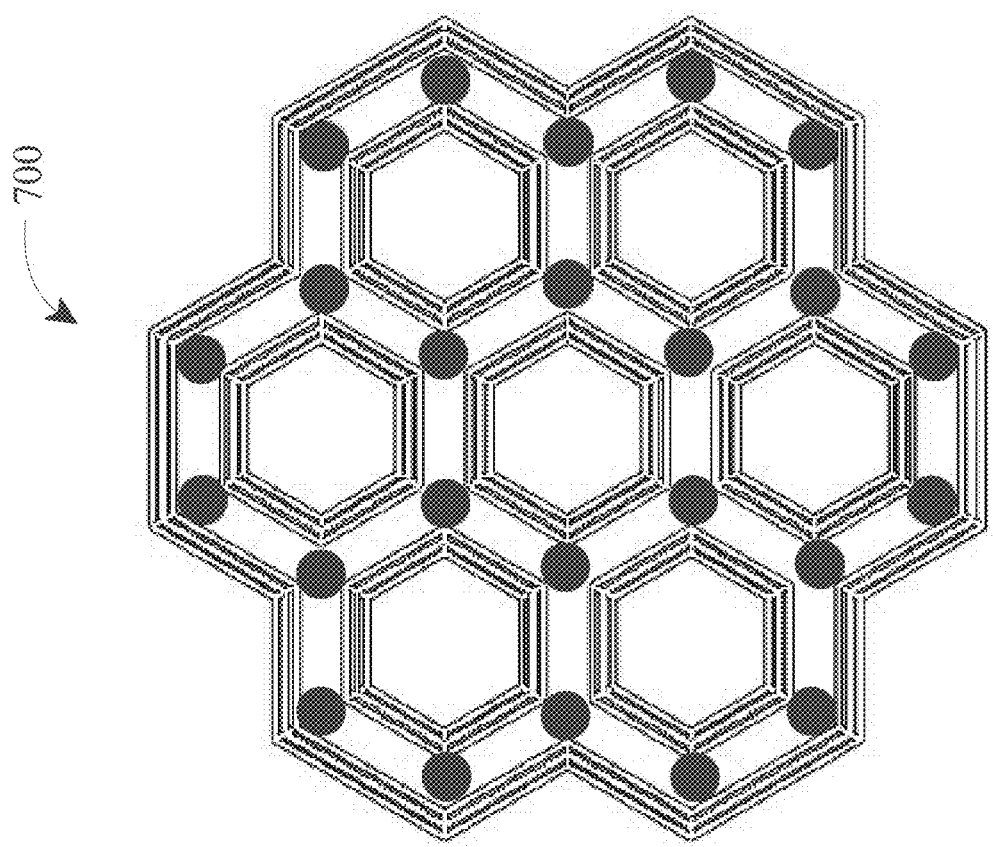
FIG. 7 is an exemplary embodiment of pin placement of a part with hexagonal structures.

Now referring to FIG. 7, an exemplary embodiment of pin placement of a part 700 with one or more hexagonal structures is illustrated. In an embodiment, part 700 may include a honeycomb ribbing structure. In such an embodiment, rule engine may include one or more rules related to pin placement at each vertex of plurality of vertices (e.g., 6 vertices) of each hexagonal structure. In case wherein plurality of hexagonal structures is interconnected, edges including vertices may be shared between multiple hexagonal structures; therefore, pin locations on shared features may be shared as well. Alternatively, rule engine may include one or more rules related to avoiding pin placement at center of a hexagonal cell. Such pin placement may cause deformation or damage during ejection process.

Figure 8:
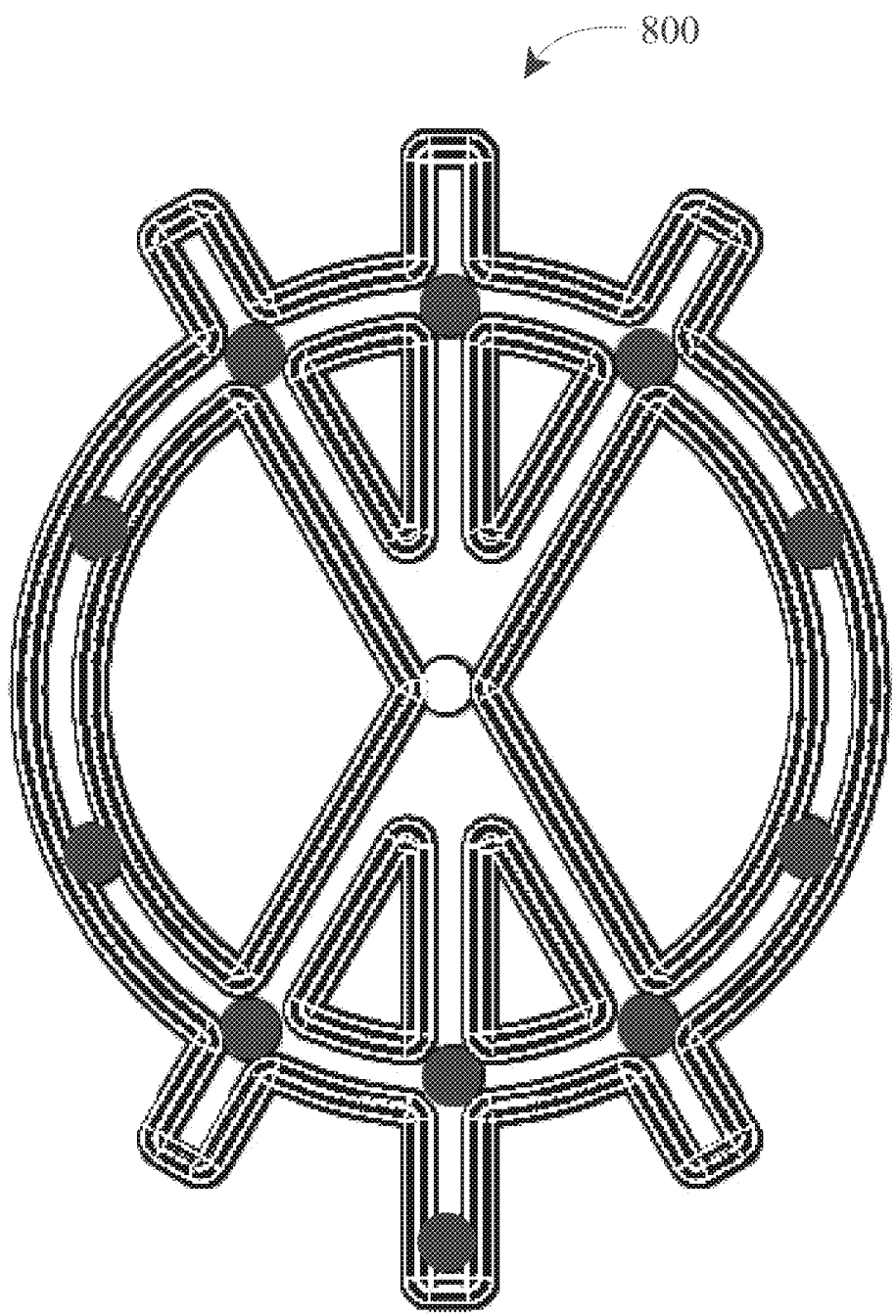
FIG. 8 is an exemplary embodiment of pin placement of a part with a circular ribbing and multiple intersections.

Now referring to FIG. 8, an exemplary embodiment of pin placement of a part 800 with a circular ribbing and multiple intersections is illustrated. In an embodiment, part 800 may include a central circular ribbing that radiates outward, for example, a wheal. In such an embodiment, circular ribbing may be intersected at multiple locations by a plurality of linear ribs that run from the center of the circle to its periphery, creating a series of intersections where linear ribs meet the circular ribbing. In some cases, pin may be placed at each intersection. Intersection are stiffer than non-intersection ribs, so it transfer the ejection forces effectively without causing deformation or breakage. Additionally, pin may be placed evenly around the circular ribbing. In some cases, interval of pins may be determined based on the arc length between intersections, which is parametrized and the parameters are changes for types of plastics and draft angles. For instance, with enough draft angles the number of interval pins are reduced. Further, at least a pin may be placed at the end i.e., the centroid of circular ribbing where all linear ribs intersect.

Figure 9:
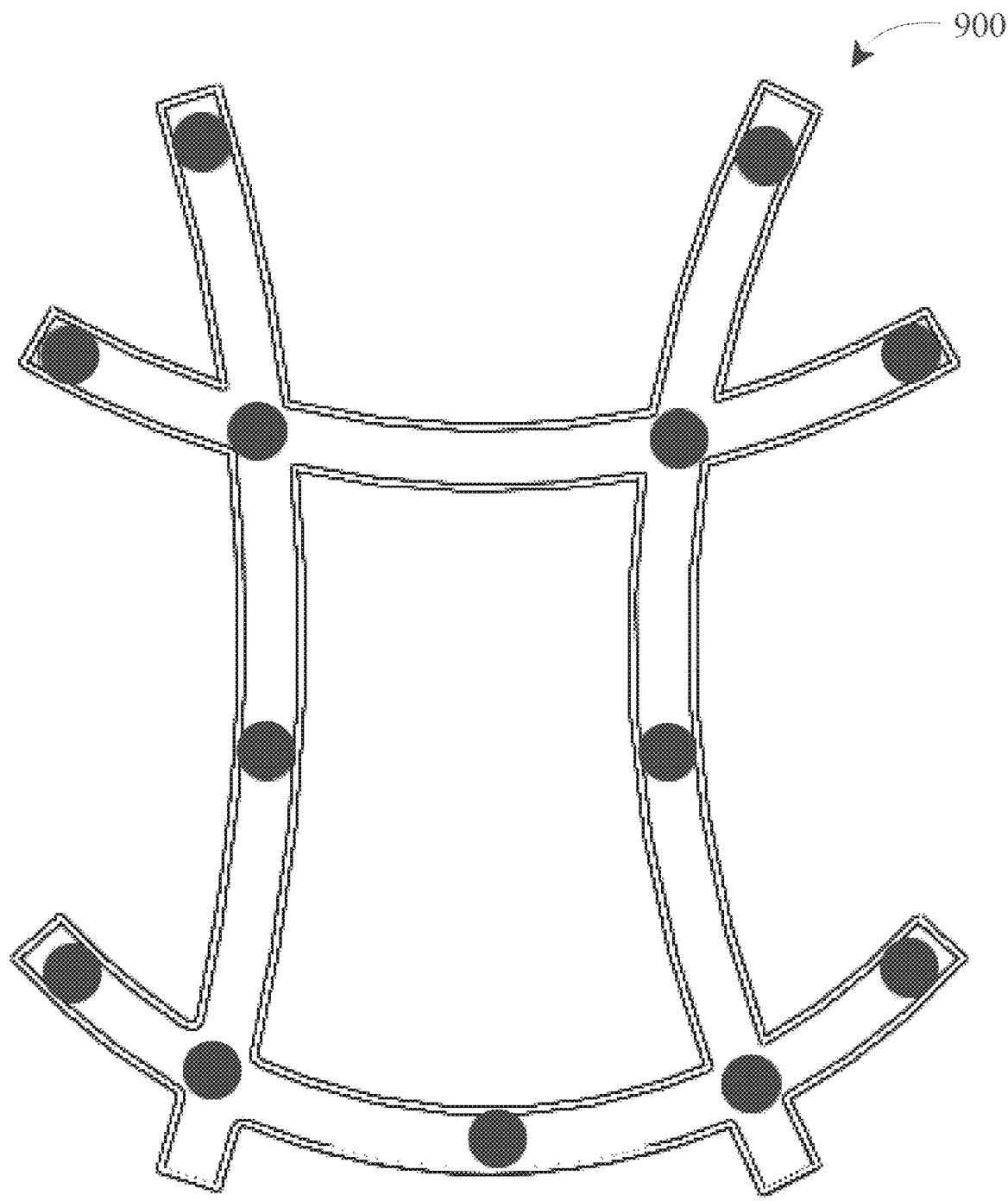
FIG. 9 is an exemplary embodiment of pin placement of a part 900 with a curved ribbing and multiple meeting angle intersections.

Now referring to FIG. 9, an exemplary embodiment of pin placement of a part 900 with a curved ribbing and multiple meeting angle intersections is illustrated. In some cases, intersections may include one or more fileted intersection. In other cases, intersections may include intersections without any draft or fillets. In these cases, at least a pin may be placed at each intersection, ends, and intervals. In some cases, pin placement at intersection may be at the center, instead of largest inscribed circle as described above. When one or more semicircular ribbings, curved ribbings, and straight ribbings intersect at a single pint, same rule may be applied.

Figure 10:
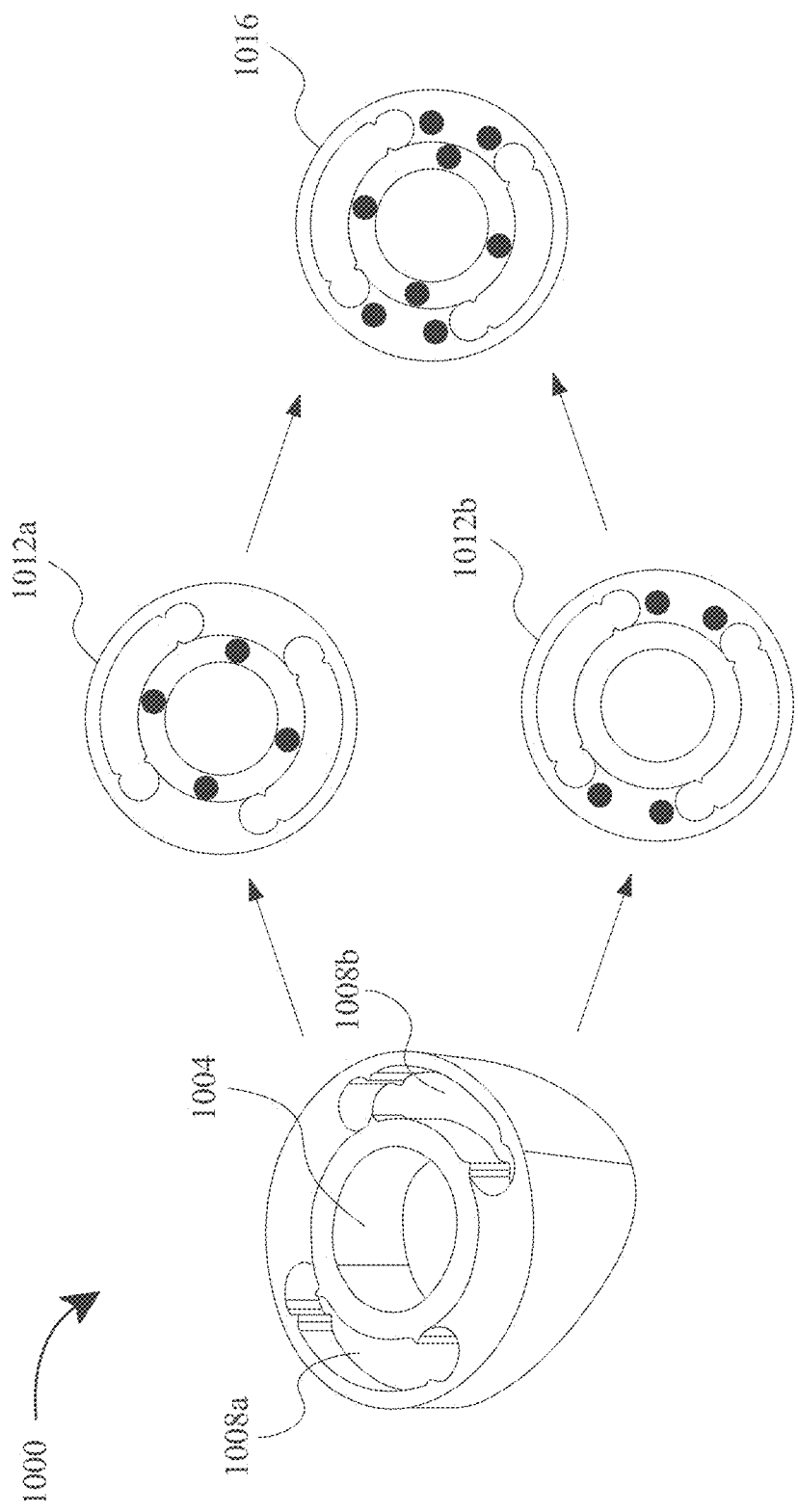
FIG. 10 is an exemplary embodiment of pin placement of a complex part by combining multiple rules.

Now referring to FIG. 10, an exemplary embodiment of pin placement of a complex part 1000 by combining multiple rules. In an embodiment, part 1000 may include a through hole feature 1004 with one or more blind cut features 1008*a-b* on the side. In such an embodiment, rule engine may be configured to combine a first rule 1012*a* and a second rule 1012*b* to determine plurality of pin placement configurations and generate pin placement schema 1016 of described part 1000. In some cases, each rule may be associated with at least a part feature. In a non-limiting example, first rule 1012*a* may be associated with through hole feature 1004 and second rule 1012*b* may be associated with blind cut features 1008*a-b*, wherein the first rule 1012*a* may dictate that "pins should be placed evenly placed around the perimeter of the through hole feature 1004," and the second rule 1012*b* may dictate that "pins should be placed evenly on each side around the blind cut features 1008*a-b*. In some cases, a third rule i.e., "the number of pins should be determined based on maximum allowable arc length/distance between pins (per side)" may also be applied as well to optimize the distribution of plurality pins around complex geometries of described part 1000.

Figure 11:
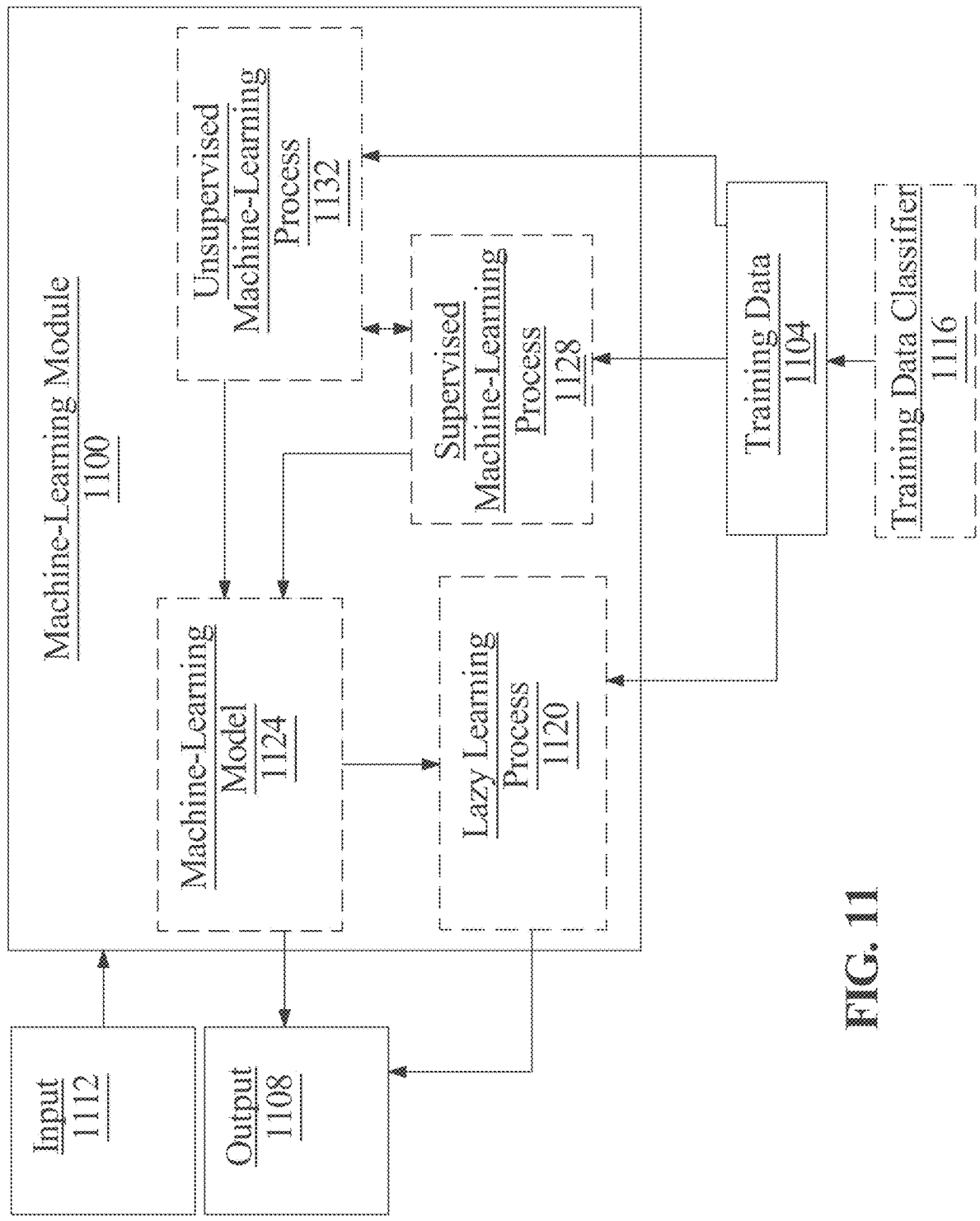
FIG. 11 is a block diagram of an exemplary embodiment of a machine learning module.

Referring now to FIG. 11, an exemplary embodiment of a machine-learning module 1100 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 1104 to generate an algorithm instantiated in hardware or software logic, data structures, and/or functions that will be performed by a computing device/module to produce outputs 1108 given data provided as inputs 1112; this is in contrast to a non-machine learning software program where the commands to be executed are determined in advance by a user and written in a programming language.

Still referring to FIG. 11, "training data," as used herein, is data containing correlations that a machine-learning process may use to model relationships between two or more categories of data elements. For instance, and without limitation, training data 1104 may include a plurality of data entries, also known as "training examples," each entry representing a set of data elements that were recorded, received, and/or generated together; data elements may be correlated by shared existence in a given data entry, by proximity in a given data entry, or the like. Multiple data entries in training data 1104 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 1104 according to various correlations; correlations may indicate causative and/or predictive links between categories of data elements, which may be modeled as relationships such as mathematical relationships by machine-learning processes as described in further detail below. Training data 1104 may be formatted and/or organized by categories of data elements, for instance by associating data elements with one or more descriptors corresponding to categories of data elements. As a non-limiting example, training data 1104 may include data entered in standardized forms by persons or processes, such that entry of a given data element in a given field in a form may be mapped to one or more descriptors of categories. Elements in training data 1104 may be linked to descriptors of categories by tags, tokens, or other data elements; for instance, and without limitation, training data 1104 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 11, training data 1104 may include one or more elements that are not categorized; that is, training data 1104 may not be formatted or contain descriptors for some elements of data. Machine-learning algorithms and/or other processes may sort training data 1104 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 1104 to be made applicable for two or more distinct machine-learning algorithms as described in further detail below. Training data 1104 used by machine-learning module 1100 may correlate any input data as described in this disclosure to any output data as described in this disclosure. As a non-limiting illustrative example training data may include a plurality of part data as input correlated to a plurality of part features as output.

Further referring to FIG. 11, training data may be filtered, sorted, and/or selected using one or more supervised and/or unsupervised machine-learning processes and/or models as described in further detail below; such models may include without limitation a training data classifier 1116. Training data classifier 1116 may include a "classifier," which as used in this disclosure is a machine-learning model as defined below, such as a data structure representing and/or using a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. A distance metric may include any norm, such as, without limitation, a Pythagorean norm. Machine-learning module 1100 may generate a classifier using a classification algorithm, defined as a processes whereby a computing device and/or any module and/or component operating thereon derives a classifier from training data 1104. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 11, computing device 1104 may be configured to generate a classifier using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as P (A/B)=P (B/A) P (A)=P (B), where P (A/B) is the probability of hypothesis A given data B also known as posterior probability; P (B/A) is the probability of data B given that the hypothesis A was true; P (A) is the probability of hypothesis A being true regardless of data also known as prior probability of A; and P (B) is the probability of the data regardless of the hypothesis. A naïve Bayes algorithm may be generated by first transforming training data into a frequency table. Computing device 1104 may then calculate a likelihood table by calculating probabilities of different data entries and classification labels. Computing device 1104 may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 11, computing device 1104 may be configured to generate a classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 11, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

With further reference to FIG. 11, training examples for use as training data may be selected from a population of potential examples according to cohorts relevant to an analytical problem to be solved, a classification task, or the like. Alternatively or additionally, training data may be selected to span a set of likely circumstances or inputs for a machine-learning model and/or process to encounter when deployed. For instance, and without limitation, for each category of input data to a machine-learning process or model that may exist in a range of values in a population of phenomena such as images, user data, process data, physical data, or the like, a computing device, processor, and/or machine-learning model may select training examples representing each possible value on such a range and/or a representative sample of values on such a range. Selection of a representative sample may include selection of training examples in proportions matching a statistically determined and/or predicted distribution of such values according to relative frequency, such that, for instance, values encountered more frequently in a population of data so analyzed are represented by more training examples than values that are encountered less frequently. Alternatively or additionally, a set of training examples may be compared to a collection of representative values in a database and/or presented to a user, so that a process can detect, automatically or via user input, one or more values that are not included in the set of training examples. Computing device, processor, and/or module may automatically generate a missing training example; this may be done by receiving and/or retrieving a missing input and/or output value and correlating the missing input and/or output value with a corresponding output and/or input value collocated in a data record with the retrieved value, provided by a user and/or other device, or the like.

Continuing to refer to FIG. 11, computer, processor, and/or module may be configured to preprocess training data. "Preprocessing" training data, as used in this disclosure, is transforming training data from raw form to a format that can be used for training a machine learning model. Preprocessing may include sanitizing, feature selection, feature scaling, data augmentation and the like.

Still referring to FIG. 11, computer, processor, and/or module may be configured to sanitize training data. "Sanitizing" training data, as used in this disclosure, is a process whereby training examples are removed that interfere with convergence of a machine-learning model and/or process to a useful result. For instance, and without limitation, a training example may include an input and/or output value that is an outlier from typically encountered values, such that a machine-learning algorithm using the training example will be adapted to an unlikely amount as an input and/or output; a value that is more than a threshold number of standard deviations away from an average, mean, or expected value, for instance, may be eliminated. Alternatively or additionally, one or more training examples may be identified as having poor quality data, where "poor quality" is defined as having a signal to noise ratio below a threshold value. Sanitizing may include steps such as removing duplicative or otherwise redundant data, interpolating missing data, correcting data errors, standardizing data, identifying outliers, and the like. In a nonlimiting example, sanitization may include utilizing algorithms for identifying duplicate entries or spell-check algorithms.

As a non-limiting example, and with further reference to FIG. 11, images used to train an image classifier or other machine-learning model and/or process that takes images as inputs or generates images as outputs may be rejected if image quality is below a threshold value. For instance, and without limitation, computing device, processor, and/or module may perform blur detection, and eliminate one or more Blur detection may be performed, as a non-limiting example, by taking Fourier transform, or an approximation such as a Fast Fourier Transform (FFT) of the image and analyzing a distribution of low and high frequencies in the resulting frequency-domain depiction of the image; numbers of high-frequency values below a threshold level may indicate blurriness. As a further non-limiting example, detection of blurriness may be performed by convolving an image, a channel of an image, or the like with a Laplacian kernel; this may generate a numerical score reflecting a number of rapid changes in intensity shown in the image, such that a high score indicates clarity and a low score indicates blurriness. Blurriness detection may be performed using a gradient-based operator, which measures operators based on the gradient or first derivative of an image, based on the hypothesis that rapid changes indicate sharp edges in the image, and thus are indicative of a lower degree of blurriness. Blur detection may be performed using Wavelet-based operator, which takes advantage of the capability of coefficients of the discrete wavelet transform to describe the frequency and spatial content of images. Blur detection may be performed using statistics-based operators take advantage of several image statistics as texture descriptors in order to compute a focus level. Blur detection may be performed by using discrete cosine transform (DCT) coefficients in order to compute a focus level of an image from its frequency content.

Continuing to refer to FIG. 11, computing device, processor, and/or module may be configured to precondition one or more training examples. For instance, and without limitation, where a machine learning model and/or process has one or more inputs and/or outputs requiring, transmitting, or receiving a certain number of bits, samples, or other units of data, one or more training examples' elements to be used as or compared to inputs and/or outputs may be modified to have such a number of units of data. For instance, a computing device, processor, and/or module may convert a smaller number of units, such as in a low pixel count image, into a desired number of units, for instance by upsampling and interpolating. As a non-limiting example, a low pixel count image may have 100 pixels, however a desired number of pixels may be 128. Processor may interpolate the low pixel count image to convert the 100 pixels into 128 pixels. It should also be noted that one of ordinary skill in the art, upon reading this disclosure, would know the various methods to interpolate a smaller number of data units such as samples, pixels, bits, or the like to a desired number of such units. In some instances, a set of interpolation rules may be trained by sets of highly detailed inputs and/or outputs and corresponding inputs and/or outputs downsampled to smaller numbers of units, and a neural network or other machine learning model that is trained to predict interpolated pixel values using the training data. As a non-limiting example, a sample input and/or output, such as a sample picture, with sample-expanded data units (e.g., pixels added between the original pixels) may be input to a neural network or machine-learning model and output a pseudo replica sample-picture with dummy values assigned to pixels between the original pixels based on a set of interpolation rules. As a non-limiting example, in the context of an image classifier, a machine-learning model may have a set of interpolation rules trained by sets of highly detailed images and images that have been downsampled to smaller numbers of pixels, and a neural network or other machine learning model that is trained using those examples to predict interpolated pixel values in a facial picture context. As a result, an input with sample-expanded data units (the ones added between the original data units, with dummy values) may be run through a trained neural network and/or model, which may fill in values to replace the dummy values. Alternatively or additionally, processor, computing device, and/or module may utilize sample expander methods, a low-pass filter, or both. As used in this disclosure, a "low-pass filter" is a filter that passes signals with a frequency lower than a selected cutoff frequency and attenuates signals with frequencies higher than the cutoff frequency. The exact frequency response of the filter depends on the filter design. Computing device, processor, and/or module may use averaging, such as luma or chroma averaging in images, to fill in data units in between original data units.

In some embodiments, and with continued reference to FIG. 11, computing device, processor, and/or module may down-sample elements of a training example to a desired lower number of data elements. As a non-limiting example, a high pixel count image may have 256 pixels, however a desired number of pixels may be 128. Processor may downsample the high pixel count image to convert the 256 pixels into 128 pixels. In some embodiments, processor may be configured to perform downsampling on data. Downsampling, also known as decimation, may include removing every Nth entry in a sequence of samples, all but every Nth entry, or the like, which is a process known as "compression," and may be performed, for instance by an N-sample compressor implemented using hardware or software. Anti-aliasing and/or anti-imaging filters, and/or low-pass filters, may be used to clean up side-effects of compression.

Further referring to FIG. 11, feature selection includes narrowing and/or filtering training data to exclude features and/or elements, or training data including such elements, that are not relevant to a purpose for which a trained machine-learning model and/or algorithm is being trained, and/or collection of features and/or elements, or training data including such elements, on the basis of relevance or utility for an intended task or purpose for a trained machine-learning model and/or algorithm is being trained. Feature selection may be implemented, without limitation, using any process described in this disclosure, including without limitation using training data classifiers, exclusion of outliers, or the like.

With continued reference to FIG. 11, feature scaling may include, without limitation, normalization of data entries, which may be accomplished by dividing numerical fields by norms thereof, for instance as performed for vector normalization. Feature scaling may include absolute maximum scaling, wherein each quantitative datum is divided by the maximum absolute value of all quantitative data of a set or subset of quantitative data. Feature scaling may include min-max scaling, in which each value X has a minimum value $X_{min}$ in a set or subset of values subtracted therefrom, with the result divided by the range of the values, give maximum value in the set or subset $$X_{max} : X_{new} = \frac{X - X_{min}}{X_{max} - X_{min}}.$$

Feature scaling may include mean normalization, which involves use of a mean value of a set and/or subset of values, $X_{mean}$ with maximum and minimum values:

$$X_{new} = \frac{X - X_{mean}}{X_{max} - X_{min}}.$$

Feature scaling may include standardization, where a difference between X and $X_{mean}$ is divided by a standard deviation σ of a set or subset of values:

$$X_{new} = \frac{X - X_{mean}}{\sigma}.$$

Scaling may be performed using a median value of a set or subset $X_{median}$ and/or interquartile range (IQR), which represents the difference between the 25th percentile value and the $50^{th}$ percentile value (or closest values thereto by a rounding protocol), such as:

$$X_{new} = \frac{X - X_{median}}{IQR}.$$

Persons skilled in the art, upon reviewing the entirety of this disclosure, will be aware of various alternative or additional approaches that may be used for feature scaling.

Further referring to FIG. 11, computing device, processor, and/or module may be configured to perform one or more processes of data augmentation. "Data augmentation" as used in this disclosure is addition of data to a training set using elements and/or entries already in the dataset. Data augmentation may be accomplished, without limitation, using interpolation, generation of modified copies of existing entries and/or examples, and/or one or more generative AI processes, for instance using deep neural networks and/or generative adversarial networks; generative processes may be referred to alternatively in this context as "data synthesis" and as creating "synthetic data." Augmentation may include performing one or more transformations on data, such as geometric, color space, affine, brightness, cropping, and/or contrast transformations of images.

Still referring to FIG. 11, machine-learning module 1100 may be configured to perform a lazy-learning process 1120 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 1104. Heuristic may include selecting some number of highest-ranking associations and/or training data 1104 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 11, machine-learning processes as described in this disclosure may be used to generate machine-learning models 1124. A "machine-learning model," as used in this disclosure, is a data structure representing and/or instantiating a mathematical and/or algorithmic representation of a relationship between inputs and outputs, as generated using any machine-learning process including without limitation any process as described above, and stored in memory; an input is submitted to a machine-learning model 1124 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 1124 may be generated by creating an artificial neural network, such as a convolutional neural network comprising an input layer of nodes, one or more intermediate layers, and an output layer of nodes. Connections between nodes may be created via the process of "training" the network, in which elements from a training data 1104 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 11, machine-learning algorithms may include at least a supervised machine-learning process 1128. At least a supervised machine-learning process 1128, as defined herein, include algorithms that receive a training set relating a number of inputs to a number of outputs, and seek to generate one or more data structures representing and/or instantiating one or more mathematical relations relating inputs to outputs, where each of the one or more mathematical relations is optimal according to some criterion specified to the algorithm using some scoring function. For instance, a supervised learning algorithm may include plurality of part data e.g., 3D CAD models as described above as inputs, plurality of part features as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 1104. Persons skilled in the art, upon reviewing the entirety of this disclosure, will be aware of various possible variations of at least a supervised machine-learning process 1128 that may be used to determine relation between inputs and outputs. Supervised machine-learning processes may include classification algorithms as defined above.

With further reference to FIG. 11, training a supervised machine-learning process may include, without limitation, iteratively updating coefficients, biases, weights based on an error function, expected loss, and/or risk function. For instance, an output generated by a supervised machine-learning model using an input example in a training example may be compared to an output example from the training example; an error function may be generated based on the comparison, which may include any error function suitable for use with any machine-learning algorithm described in this disclosure, including a square of a difference between one or more sets of compared values or the like. Such an error function may be used in turn to update one or more weights, biases, coefficients, or other parameters of a machine-learning model through any suitable process including without limitation gradient descent processes, least-squares processes, and/or other processes described in this disclosure. This may be done iteratively and/or recursively to gradually tune such weights, biases, coefficients, or other parameters. Updating may be performed, in neural networks, using one or more back-propagation algorithms. Iterative and/or recursive updates to weights, biases, coefficients, or other parameters as described above may be performed until currently available training data is exhausted and/or until a convergence test is passed, where a "convergence test" is a test for a condition selected as indicating that a model and/or weights, biases, coefficients, or other parameters thereof has reached a degree of accuracy. A convergence test may, for instance, compare a difference between two or more successive errors or error function values, where differences below a threshold amount may be taken to indicate convergence. Alternatively or additionally, one or more errors and/or error function values evaluated in training iterations may be compared to a threshold.

Still referring to FIG. 11, a computing device, processor, and/or module may be configured to perform method, method step, sequence of method steps and/or algorithm described in reference to this figure, in any order and with any degree of repetition. For instance, a computing device, processor, and/or module may be configured to perform a single step, sequence and/or algorithm repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. A computing device, processor, and/or module may perform any step, sequence of steps, or algorithm in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Further referring to FIG. 11, machine learning processes may include at least an unsupervised machine-learning processes 1132. An unsupervised machine-learning process, as used herein, is a process that derives inferences in datasets without regard to labels; as a result, an unsupervised machine-learning process may be free to discover any structure, relationship, and/or correlation provided in the data. Unsupervised processes 1132 may not require a response variable; unsupervised processes 1132 may be used to find interesting patterns and/or inferences between variables, to determine a degree of correlation between two or more variables, or the like.

Still referring to FIG. 11, machine-learning module 1100 may be designed and configured to create a machine-learning model 1124 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 11, machine-learning algorithms may include, without limitation, linear discriminant analysis. Machine-learning algorithm may include quadratic discriminant analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized trees, AdaBoost, gradient tree boosting, and/or voting classifier methods. Machine-learning algorithms may include neural net algorithms, including convolutional neural net processes.

Still referring to FIG. 11, a machine-learning model and/or process may be deployed or instantiated by incorporation into a program, apparatus, system and/or module. For instance, and without limitation, a machine-learning model, neural network, and/or some or all parameters thereof may be stored and/or deployed in any memory or circuitry. Parameters such as coefficients, weights, and/or biases may be stored as circuit-based constants, such as arrays of wires and/or binary inputs and/or outputs set at logic "1" and "0" voltage levels in a logic circuit to represent a number according to any suitable encoding system including twos complement or the like or may be stored in any volatile and/or non-volatile memory. Similarly, mathematical operations and input and/or output of data to or from models, neural network layers, or the like may be instantiated in hardware circuitry and/or in the form of instructions in firmware, machine-code such as binary operation code instructions, assembly language, or any higher-order programming language. Any technology for hardware and/or software instantiation of memory, instructions, data structures, and/or algorithms may be used to instantiate a machine-learning process and/or model, including without limitation any combination of production and/or configuration of non-reconfigurable hardware elements, circuits, and/or modules such as without limitation ASICs, production and/or configuration of reconfigurable hardware elements, circuits, and/or modules such as without limitation FPGAs, production and/or of non-reconfigurable and/or configuration non-rewritable memory elements, circuits, and/or modules such as without limitation non-rewritable ROM, production and/or configuration of reconfigurable and/or rewritable memory elements, circuits, and/or modules such as without limitation rewritable ROM or other memory technology described in this disclosure, and/or production and/or configuration of any computing device and/or component thereof as described in this disclosure. Such deployed and/or instantiated machine-learning model and/or algorithm may receive inputs from any other process, module, and/or component described in this disclosure, and produce outputs to any other process, module, and/or component described in this disclosure.

Continuing to refer to FIG. 11, any process of training, retraining, deployment, and/or instantiation of any machine-learning model and/or algorithm may be performed and/or repeated after an initial deployment and/or instantiation to correct, refine, and/or improve the machine-learning model and/or algorithm. Such retraining, deployment, and/or instantiation may be performed as a periodic or regular process, such as retraining, deployment, and/or instantiation at regular elapsed time periods, after some measure of volume such as a number of bytes or other measures of data processed, a number of uses or performances of processes described in this disclosure, or the like, and/or according to a software, firmware, or other update schedule. Alternatively or additionally, retraining, deployment, and/or instantiation may be event-based, and may be triggered, without limitation, by user inputs indicating sub-optimal or otherwise problematic performance and/or by automated field testing and/or auditing processes, which may compare outputs of machine-learning models and/or algorithms, and/or errors and/or error functions thereof, to any thresholds, convergence tests, or the like, and/or may compare outputs of processes described herein to similar thresholds, convergence tests or the like. Event-based retraining, deployment, and/or instantiation may alternatively or additionally be triggered by receipt and/or generation of one or more new training examples; a number of new training examples may be compared to a preconfigured threshold, where exceeding the preconfigured threshold may trigger retraining, deployment, and/or instantiation.

Still referring to FIG. 11, retraining and/or additional training may be performed using any process for training described above, using any currently or previously deployed version of a machine-learning model and/or algorithm as a starting point. Training data for retraining may be collected, preconditioned, sorted, classified, sanitized or otherwise processed according to any process described in this disclosure. Training data may include, without limitation, training examples including inputs and correlated outputs used, received, and/or generated from any version of any system, module, machine-learning model or algorithm, apparatus, and/or method described in this disclosure; such examples may be modified and/or labeled according to user feedback or other processes to indicate desired results, and/or may have actual or measured results from a process being modeled and/or predicted by system, module, machine-learning model or algorithm, apparatus, and/or method as "desired" results to be compared to outputs for training processes as described above.

Redeployment may be performed using any reconfiguring and/or rewriting of reconfigurable and/or rewritable circuit and/or memory elements; alternatively, redeployment may be performed by production of new hardware and/or software components, circuits, instructions, or the like, which may be added to and/or may replace existing hardware and/or software components, circuits, instructions, or the like.

Further referring to FIG. 11, one or more processes or algorithms described above may be performed by at least a dedicated hardware unit 1136. A "dedicated hardware unit," for the purposes of this figure, is a hardware component, circuit, or the like, aside from a principal control circuit and/or processor performing method steps as described in this disclosure, that is specifically designated or selected to perform one or more specific tasks and/or processes described in reference to this figure, such as without limitation preconditioning and/or sanitization of training data and/or training a machine-learning algorithm and/or model. A dedicated hardware unit 1136 may include, without limitation, a hardware unit that can perform iterative or massed calculations, such as matrix-based calculations to update or tune parameters, weights, coefficients, and/or biases of machine-learning models and/or neural networks, efficiently using pipelining, parallel processing, or the like; such a hardware unit may be optimized for such processes by, for instance, including dedicated circuitry for matrix and/or signal processing operations that includes, e.g., multiple arithmetic and/or logical circuit units such as multipliers and/or adders that can act simultaneously and/or in parallel or the like. Such dedicated hardware units 1136 may include, without limitation, graphical processing units (GPUs), dedicated signal processing modules, FPGA or other reconfigurable hardware that has been configured to instantiate parallel processing units for one or more specific tasks, or the like, A computing device, processor, apparatus, or module may be configured to instruct one or more dedicated hardware units 1136 to perform one or more operations described herein, such as evaluation of model and/or algorithm outputs, one-time or iterative updates to parameters, coefficients, weights, and/or biases, and/or any other operations such as vector and/or matrix operations as described in this disclosure.

Figure 12:
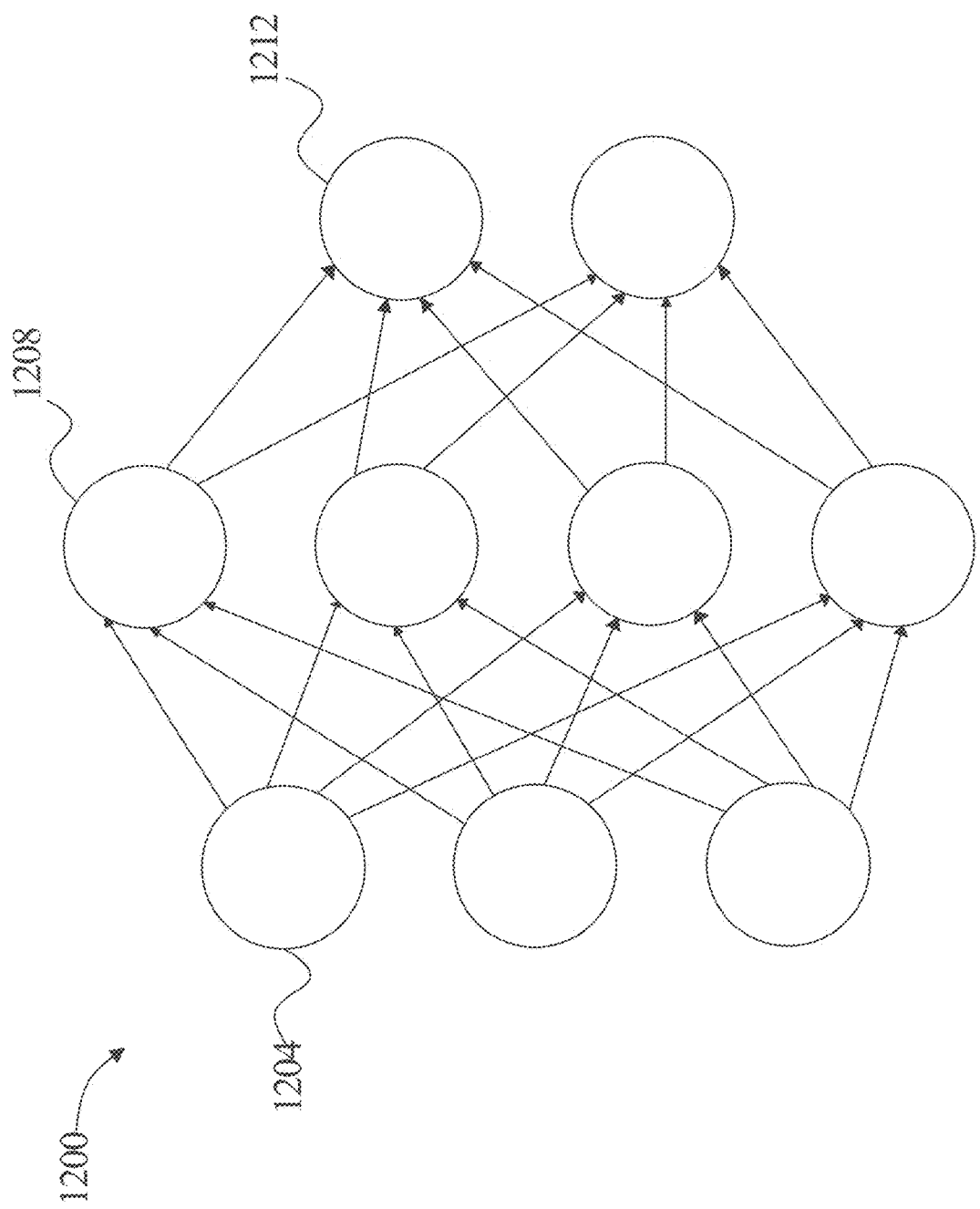
FIG. 12 is a diagram of an exemplary embodiment of a neural network.

Referring now to FIG. 12, an exemplary embodiment of neural network 1200 is illustrated. A neural network 1200 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 1204, one or more intermediate layers 1208, and an output layer of nodes 1212. In a non-limiting embodiment, input layer of nodes 1204 may include any remote display where user inputs may be provided from, while output layer of nodes 1212 may include either the local device if it has the processing capability to support the requisite machine-learning processes, or output layer of nodes 1212 may refer to a centralized, network connected processor able to remotely conduct the machine-learning processes described herein. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

With continued reference to FIG. 12, in an embodiment, neural network may include a deep neural network (DNN). As used in this disclosure, a "deep neural network" is defined as a neural network with two or more hidden layers. In a non-limiting example, neural network may include a convolutional neural network (CNN). A "convolutional neural network," for the purpose of this disclosure, is a neural network in which at least one hidden layer is a convolutional layer that convolves inputs to that layer with a subset of inputs known as a "kernel," along with one or more additional layers such as pooling layers, fully connected layers, and the like. In some cases, CNN may include, without limitation, a deep neural network (DNN) extension. Mathematical (or convolution) operations performed in the convolutional layer may include convolution of two or more functions, where the kernel may be applied to input data e.g., a plurality of 3D CAD models or part images through a sliding window approach. In some cases, convolution operations may enable processor to detect local/global patterns, edges, textures, and any other features described herein within input data as described above. Features within input data may be passed through one or more activation functions, such as without limitation, Rectified Linear Unit (ReLU), to introduce non-linearities into one or more generating processing steps as described above with reference to FIG. 3. Additionally, or alternatively, CNN may also include one or more pooling layers, wherein each pooling layer is configured to reduce the dimensionality of input data while preserving essential features within the input data. In a non-limiting example, CNN may include one or more pooling layer configured to reduce the dimensions of feature maps by applying downsampling, such as max-pooling or average pooling, to small, non-overlapping regions of one or more features.

Still referring to FIG. 12, CNN may further include one or more fully connected layers configured to combine features extracted by the convolutional and pooling layers as described above. In some cases, one or more fully connected layers may allow for higher-level pattern recognition. In a non-limiting example, one or more fully connected layers may connect every neuron (i.e., node) in its input to every neuron in its output, functioning as a traditional feedforward neural network layer. In some cases, one or more fully connected layers may be used at the end of CNN to perform high-level reasoning and produce the final output such as, without limitation, plurality of part features and/or pin locations. Further, each fully connected layer may be followed by one or more dropout layers configured to prevent overfitting, and one or more normalization layers to stabilize the learning process described herein.

With continued reference to FIG. 12, in an embodiment, training the neural network (i.e., CNN) may include selecting a suitable loss function to guide the training process. In a non-limiting example, a loss function that measures the difference between the predicted output and the ground truth may be used, such as, without limitation, mean squared error (MSE) or a custom loss function may be designed for one or more embodiments described herein. Additionally, or alternatively, optimization algorithms, such as stochastic gradient descent (SGD), may then be used to adjust CNN's parameters to minimize such loss. In a further non-limiting embodiment, instead of directly predicting classification or category of input data, CNN may be trained as a regression model to predict numerical output such as numerical pin placement configurations e.g., desired pin diameter as described above with reference to FIG. 1. Additionally, CNN may be extended with additional deep learning techniques, such as recurrent neural networks (RNNs) or attention mechanism, to capture additional features and/or data relationships within input data.

Figure 13:
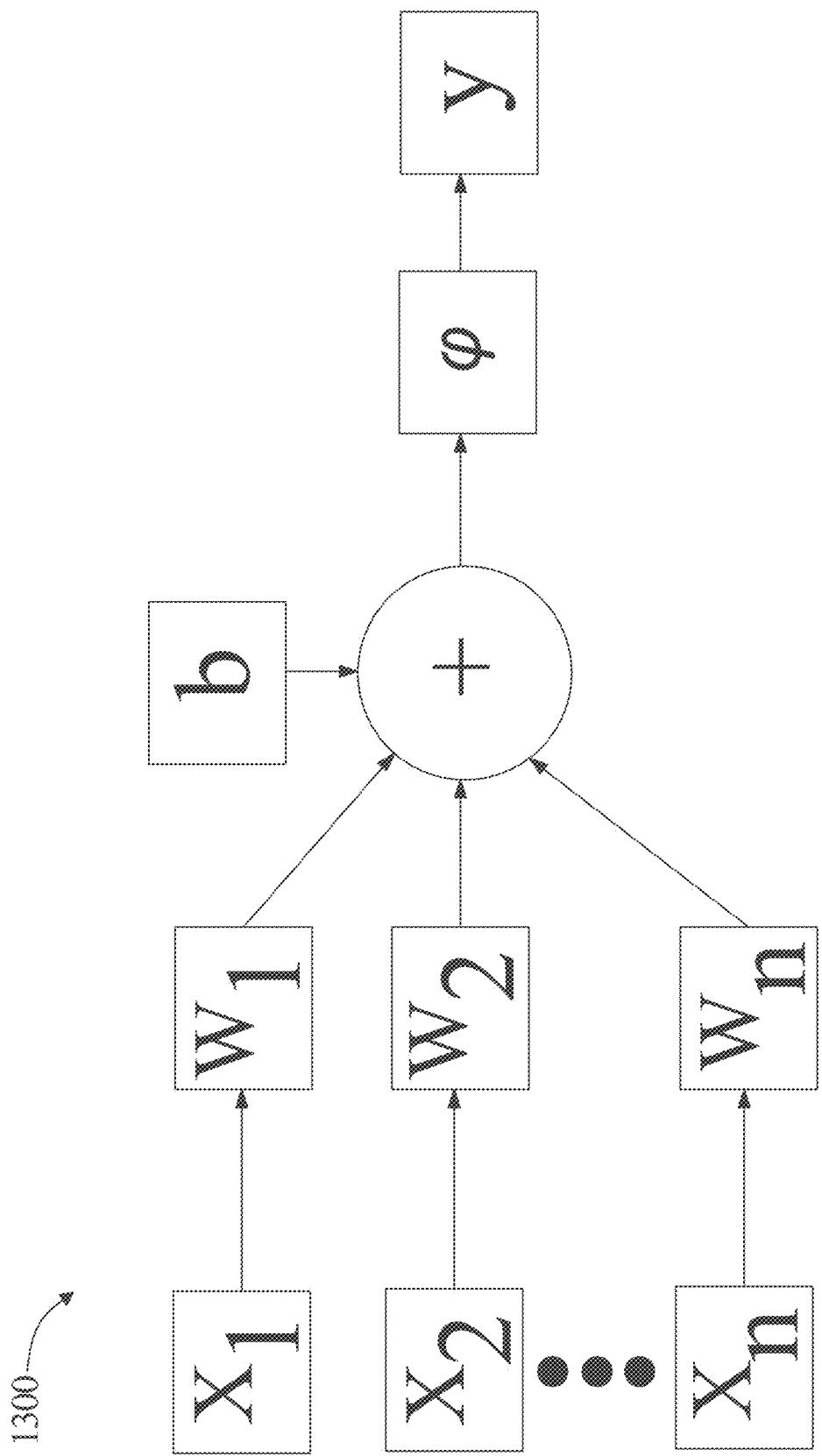
FIG. 13 is a block diagram of an exemplary embodiment of a node of a neural network.

Referring now to FIG. 13, an exemplary embodiment of a node 1300 of a neural network is illustrated. A node may include, without limitation, a plurality of inputs x; that may receive numerical values from inputs to a neural network containing the node and/or from other nodes. Node may perform one or more activation functions to produce its output given one or more inputs, such as without limitation computing a binary step function comparing an input to a threshold value and outputting either a logic 1 or logic 0 output or something equivalent, a linear activation function whereby an output is directly proportional to the input, and/or a non-linear activation function, wherein the output is not proportional to the input. Non-linear activation functions may include, without limitation, a sigmoid function of the form $$f(x) = \frac{1}{1-e^{-x}}$$

given input x, a tanh (hyperbolic tangent) function, of the form $$\frac{e^x - e^{-x}}{e^x + e^{-x}},$$

a tanh derivative function such as $f(x)=\tanh^2(x)$, a rectified linear unit function such as $f(x)=\max(0, x)$, a "leaky" and/or "parametric" rectified linear unit function such as $f(x)=\max(ax, x)$ for some a, an exponential linear units function such as $$f(x) = \begin{cases} x & \text{for } x \geq 0 \\ \alpha(e^x - 1) & \text{for } x < 0 \end{cases}$$

for some value of α (this function may be replaced and/or weighted by its own derivative in some embodiments), a softmax function such as $$f(x_i) = \frac{e^x}{\sum_i x_i}$$

where the inputs to an instant layer are $x_i$, a swish function such as $f(x)=x*\text{sigmoid}(x)$, a Gaussian error linear unit function such as $f(x)=a(1+\tanh(\sqrt{2/\pi}(x+bx^r)))$ for some values of a, b, and r, and/or a scaled exponential linear unit function such as $$f(x) = \lambda \begin{cases} \alpha(e^x - 1) & \text{for } x < 0 \\ x & \text{for } x \geq 0 \end{cases}.$$

Fundamentally, there is no limit to the nature of functions of inputs $x_i$ that may be used as activation functions. As a non-limiting and illustrative example, node may perform a weighted sum of inputs using weights $w_i$ that are multiplied by respective inputs $x_i$. Additionally, or alternatively, a bias b may be added to the weighted sum of the inputs such that an offset is added to each unit in the neural network layer that is independent of the input to the layer. The weighted sum may then be input into a function p, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 14:
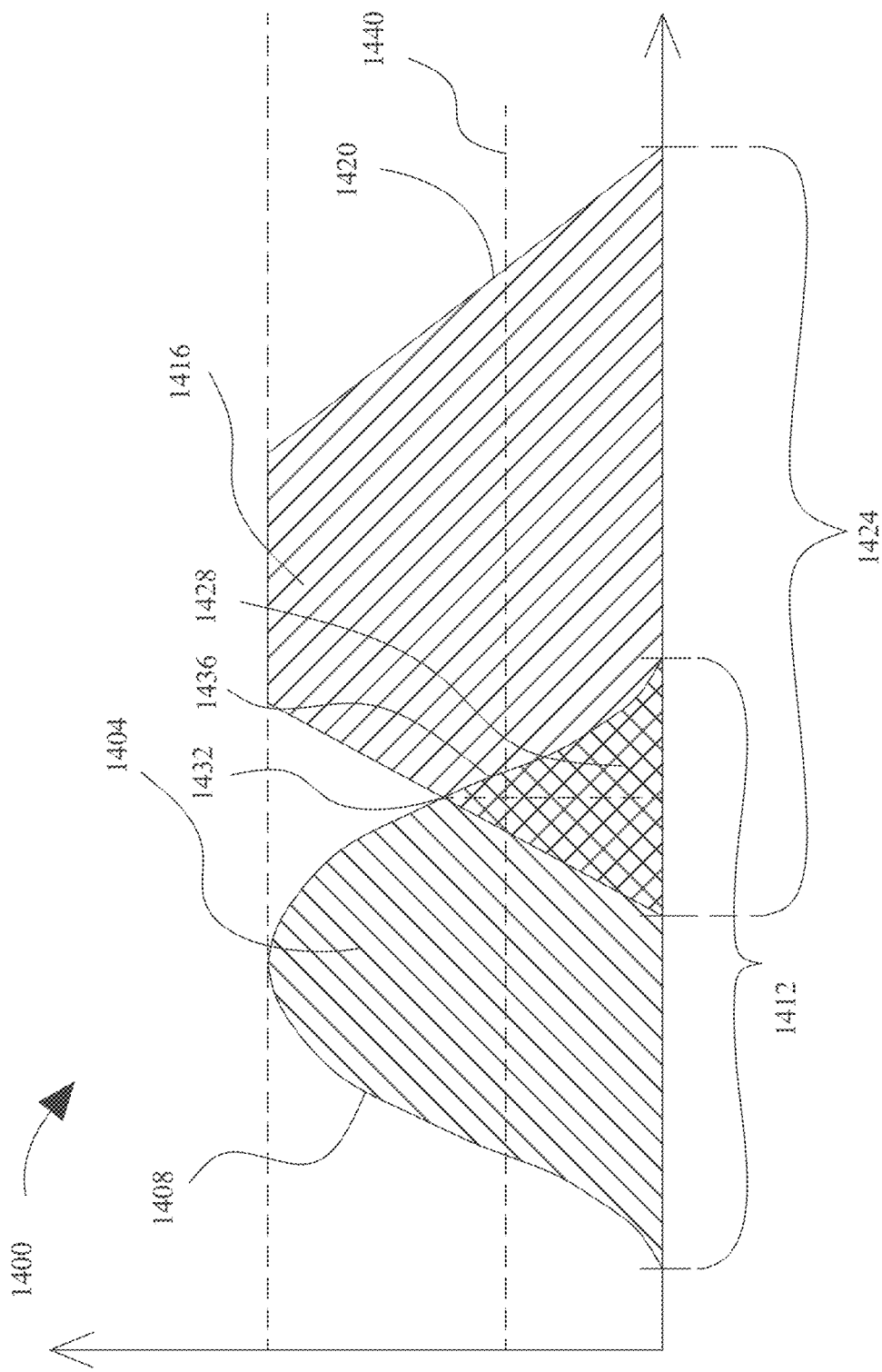
FIG. 14 is a graph illustrating an exemplary relationship between fuzzy sets.

Referring to FIG. 14, an exemplary embodiment of fuzzy set comparison 1400 is illustrated. A first fuzzy set 1404 may be represented, without limitation, according to a first membership function 1408 representing a probability that an input falling on a first range of values 1412 is a member of the first fuzzy set 1404, where the first membership function 1408 has values on a range of probabilities such as without limitation the interval [0,1], and an area beneath the first membership function 1408 may represent a set of values within first fuzzy set 1404. Although first range of values 1412 is illustrated for clarity in this exemplary depiction as a range on a single number line or axis, first range of values 1412 may be defined on two or more dimensions, representing, for instance, a Cartesian product between a plurality of ranges, curves, axes, spaces, dimensions, or the like. First membership function 1408 may include any suitable function mapping first range 1412 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, & \text{for } x > c \text{ and } x < a \\ \frac{x-a}{b-a}, & \text{for } a \le x < b \\ \frac{c-x}{c-b}, & \text{if } b < x \le c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}\left(\frac{x-c}{\sigma}\right)^2}$$

and a bell membership function may be defined as:

$$y(x, a, b, c,) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 14, first fuzzy set 1404 may represent any value or combination of values as described above, including output from one or more machine-learning models, pin diameter threshold, pin placement configurations, and/or the like, and a predetermined class, such as without limitation, plurality of part features. A second fuzzy set 1416, which may represent any value which may be represented by first fuzzy set 1404, may be defined by a second membership function 1420 on a second range 1424; second range 1424 may be identical and/or overlap with first range 1412 and/or may be combined with first range via Cartesian product or the like to generate a mapping permitting evaluation overlap of first fuzzy set 1404 and second fuzzy set 1416. Where first fuzzy set 1404 and second fuzzy set 1416 have a region 1428 that overlaps, first membership function 1408 and second membership function 1420 may intersect at a point 1432 representing a probability, as defined on probability interval, of a match between first fuzzy set 1404 and second fuzzy set 1416. Alternatively, or additionally, a single value of first and/or second fuzzy set may be located at a locus 1436 on first range 1412 and/or second range 1424, where a probability of membership may be taken by evaluation of first membership function 1408 and/or second membership function 1420 at that range point. A probability at 1428 and/or 1432 may be compared to a threshold 1440 to determine whether a positive match is indicated. Threshold 1440 may, in a non-limiting example, represent a degree of match between first fuzzy set 1404 and second fuzzy set 1416, and/or single values therein with each other or with either set, which is sufficient for purposes of the matching process; for instance, threshold may indicate a sufficient degree of overlap between an output from one or more machine-learning models and/or pin diameter threshold and a predetermined class, such as without limitation plurality of part features, for combination to occur as described above. Alternatively, or additionally, each threshold may be tuned by a machine-learning and/or statistical process, for instance and without limitation as described in further detail below.

Further referring to FIG. 14, in an embodiment, a degree of match between fuzzy sets may be used to classify a pin diameter threshold with plurality of part features. For instance, if plurality of part features has a fuzzy set matching pin diameter threshold fuzzy set by having a degree of overlap exceeding a threshold, processor 304 may classify the pin diameter threshold as belonging to the plurality of part features. Where multiple fuzzy matches are performed, degrees of match for each respective fuzzy set may be computed and aggregated through, for instance, addition, averaging, or the like, to determine an overall degree of match.

Still referring to FIG. 14, in an embodiment, a pin diameter threshold may be compared to multiple part features fuzzy sets. For instance, pin diameter threshold may be represented by a fuzzy set that is compared to each of the multiple part features fuzzy sets; and a degree of overlap exceeding a threshold between the pin diameter threshold fuzzy set and any of the multiple part features fuzzy sets may cause processor 304 to classify the pin diameter threshold as belonging to plurality of part features categorization. For instance, in one embodiment there may be two part features fuzzy sets, representing respectively a first plurality of part features and a second plurality of part features. First plurality of part features may have a first fuzzy set; Second plurality of part features may have a second fuzzy set; and pin diameter threshold may have a pin diameter threshold fuzzy set. processor 304, for example, may compare a pin diameter threshold fuzzy set with each part features fuzzy set, as described above, and classify a pin diameter threshold to either, both, or neither of first plurality of part features or/and/nor second plurality of part features. Machine-learning methods as described throughout may, in a non-limiting example, generate coefficients used in fuzzy set equations as described above, such as without limitation x, c, and σ of a Gaussian set as described above, as outputs of machine-learning methods. Likewise, pin diameter threshold may be used indirectly to determine a fuzzy set, as pin diameter threshold fuzzy set may be derived from outputs of one or more machine-learning models that take the pin diameter threshold directly or indirectly as inputs.

Still referring to FIG. 14, in some embodiments, determining the pin diameter threshold based on plurality of part features may include using a fuzzy inference engine. A fuzzy inference engine may be configured to map one or more part feature data elements using fuzzy logic. In some embodiments, part features may be arranged by a logic comparison program into pin diameter threshold arrangement. An "pin diameter threshold arrange arrangement" as used in this disclosure is any grouping of objects and/or data related to pin diameter threshold based on a pre-determined criteria. This step may be implemented as described above in FIGS. 3-4. Membership function coefficients and/or constants as described above may be tuned according to classification and/or clustering algorithms. For instance, and without limitation, a clustering algorithm may determine a Gaussian or other distribution of questions about a centroid corresponding to a given threshold level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Still referring to FIG. 14, an inference engine may be implemented according to input and/or output membership functions and/or geometric parameters such as pin placement configurations. For instance, a first membership function may represent a first measurable value pertaining to pin diameter threshold, such as a degree of proximity of an element, while a second membership function may indicate a degree of alignment of a subject thereof, or another measurable value pertaining to pin diameter threshold. Continuing the example, an output pin placement configuration may represent, without limitation, a desired pin diameter value. An inference engine may combine rules, such as: "if proximity is 'high' and alignment is optimal, the pin diameter is suitable"—the degree to which a given input function membership matches a given rule may be determined by a triangular norm or "T-norm" of the rule or output membership function with the input membership function, such as min (a, b), product of a and b, drastic product of a and b, Hamacher product of a and b, or the like, satisfying the rules of commutativity (T(a, b)=T(b, a)), monotonicity: (T(a, b)≤T(c, d) if a≤c and b≤d), (associativity: T(a, T(b, c))=T (T(a, b), c)), and the requirement that the number 1 acts as an identity element. Combinations of rules ("and" or "or" combination of rule membership determinations) may be performed using any T-conorm, as represented by an inverted T symbol or "⊥," such as max(a, b), probabilistic sum of a and b (a+b−a*b), bounded sum, and/or drastic T-conorm; any T-conorm may be used that satisfies the properties of commutativity: ⊥(a, b)=⊥(b, a), monotonicity: ⊥(a, b)≤⊥(c, d) if a≤c and b≤d, associativity: ⊥(a, ⊥(b, c))=⊥(⊥(a, b), c), and identity element of 0. Alternatively, or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively, or additionally, output rules may be replaced with functions according to the Takagi-Sugeno-King (TSK) fuzzy model.

Figure 15:
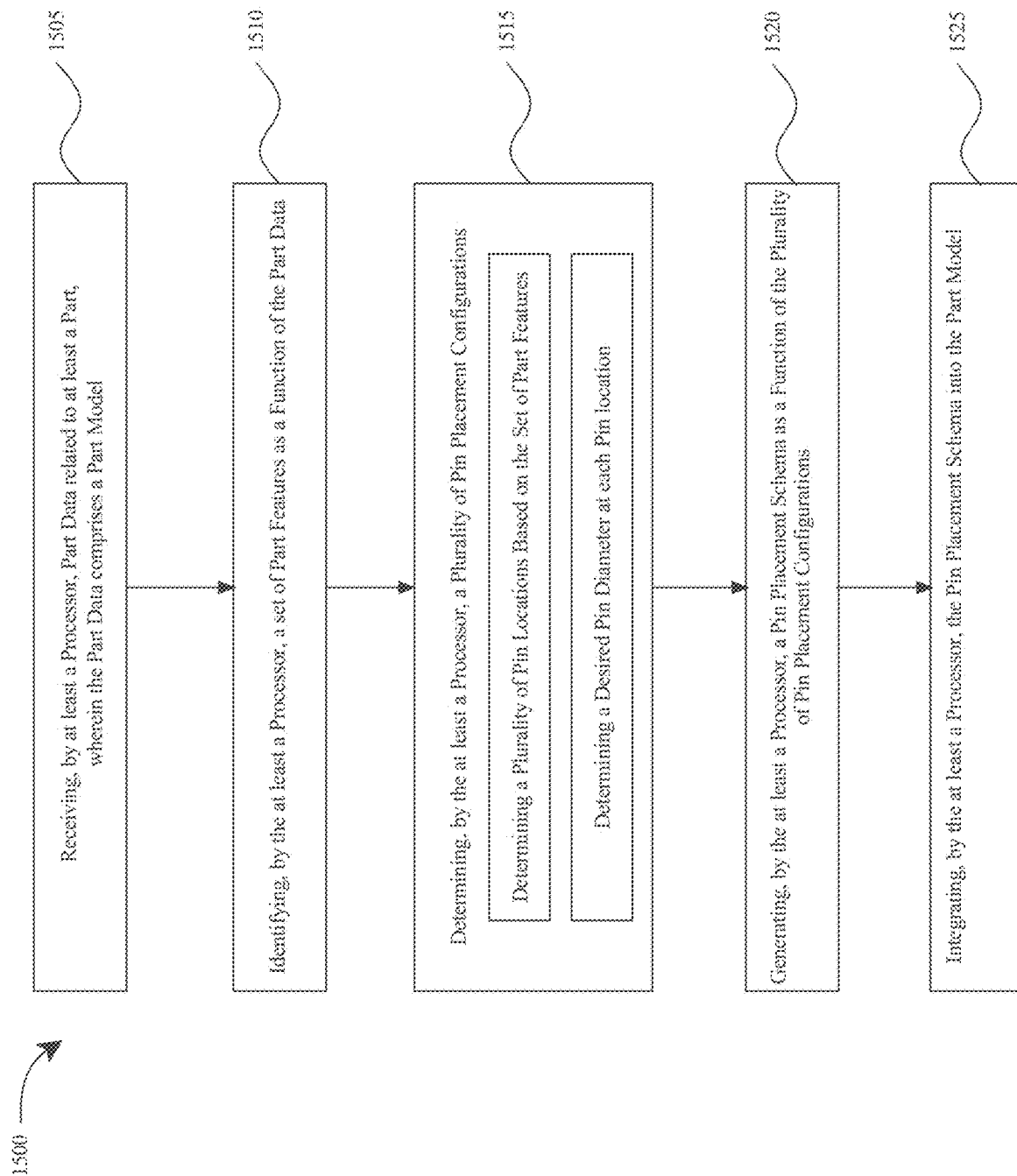
FIG. 15 is a flow diagram of an exemplary embodiment of a method for automatic pin placement in injection molding.

With continued reference to FIG. 15, a flow diagram of an exemplary embodiment a method 1500 for automatic pin placement in injection molding is illustrated. The method 1500 includes a step 1505 of receiving, by at least a processor, part data related to at least a part, wherein the part data comprises a part model associated with the at least a part. In some embodiments, the part data may include at least one CAD model. This may be implemented, without limitation, as described above with reference to FIGS. 1-13.

With continued reference to FIG. 15, method 1500 includes a step 1510 of identifying, by the at least a processor, a set of part features as a function of the part data. In some embodiments, identifying the set of part features may include scanning the at least one CAD model, and extracting a plurality of part features based on the scan. In some embodiments, identifying the set of part features may further include assign a weight to each part feature of the plurality of part features and identifying the set of part features by ranking the plurality of part features as a function of the associated weights. This may be implemented, without limitation, as described above with reference to FIGS. 1-13.

With continued reference to FIG. 15, method 1500 includes a step 1515 of determining, by the at least a processor, a plurality of pin placement configurations, wherein determining the plurality of pin placement configurations includes determining a plurality of pin locations based on the set of part features and determining a desired pin diameter at each pin location of the plurality of pin locations. In some embodiments, determining the plurality of pin locations may include determining the plurality of pin locations using a rule engine containing a pre-determined set of rules. In some embodiments, determining the desired pin diameter may include identifying a plurality of boundary elements based on one or more adjacent part features at each pin location of the plurality of pin locations. In some embodiments, determining the desired pin diameter may include calculating a pin diameter threshold as a function of the plurality of boundary elements and determining the desired pin diameter as a function of the calculated pin diameter threshold. In some embodiments, determining the desired pin diameter may include refining the initial pin diameter as a function of a plurality of additional boundary elements. In other embodiments, determining the plurality of pin placement configurations may include training a pin placement machine learning model using pin placement training data, wherein the pin placement training data may include a plurality of part features as input correlated to a plurality of pin placement configurations as output; and determining the plurality of pin placement configurations as a function of the trained pin placement machine learning model. This may be implemented, without limitation, as described above with reference to FIGS. 1-13.

With continued reference to FIG. 15, method 1500 includes a step 1520 of generating, by the at least a processor, a pin placement schema as a function of the plurality of pin placement configurations. Method 1500 may further include a step of displaying the generated pin placement schema to a user using a user interface at a display device. This may be implemented, without limitation, as described above with reference to FIGS. 1-13.

With continued reference to FIG. 15, method 1500 includes a step 1525 of integrating, by the at least a processor, the pin placement schema into the part model. In some embodiments, integrating the pin placement schema may include implementing the pin placement schema by placing a plurality of pins with desired pin diameters at locations on an injection molding machine corresponding to the plurality of pin locations, thereby ejecting the at least a part using the plurality of pins upon a completion of the injection molding process without causing deformation to the at least a part. This may be implemented, without limitation, as described above with reference to FIGS. 1-13.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 16:
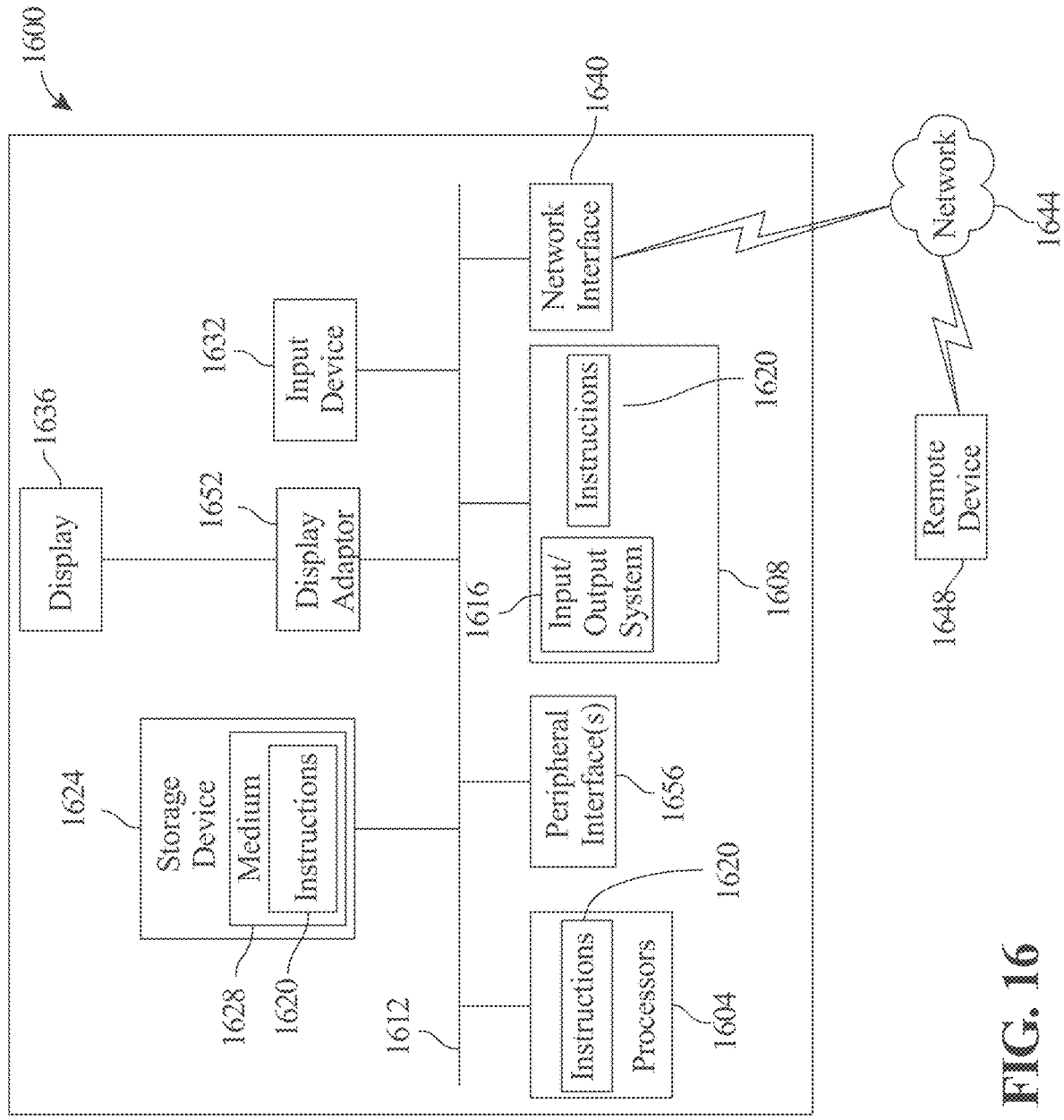
FIG. 16 is a block diagram of a computing system that can be used to implement any one or more of the methodologies disclosed herein and any one or more portions thereof.

FIG. 16 shows a diagrammatic representation of one embodiment of a computing device in the exemplary form of a computer system 1600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1600 includes a processor 1604 and a memory 1608 that communicate with each other, and with other components, via a bus 1612. Bus 1612 may include any of several types of bus structures including, but not limited to, a memory bus, a memory controller, a peripheral bus, a local bus, and any combinations thereof, using any of a variety of bus architectures.

Processor 1604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 1604 may be organized according to Von Neumann and/or Harvard architecture as a non-limiting example. Processor 1604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 1608 may include various components (e.g., machine-readable media) including, but not limited to, a random-access memory component, a read only component, and any combinations thereof. In one example, a basic input/output system 1616 (BIOS), including basic routines that help to transfer information between elements within computer system 1600, such as during start-up, may be stored in memory 1608. Memory 1608 may also include (e.g., stored on one or more machine-readable media) instructions (e.g., software) 1620 embodying any one or more of the aspects and/or methodologies of the present disclosure. In another example, memory 1608 may further include any number of program modules including, but not limited to, an operating system, one or more application programs, other program modules, program data, and any combinations thereof.

Computer system 1600 may also include a storage device 1624. Examples of a storage device (e.g., storage device 1624) include, but are not limited to, a hard disk drive, a magnetic disk drive, an optical disc drive in combination with an optical medium, a solid-state memory device, and any combinations thereof. Storage device 1624 may be connected to bus 1612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 1624 (or one or more components thereof) may be removably interfaced with computer system 1600 (e.g., via an external port connector (not shown)). Particularly, storage device 1624 and an associated machine-readable medium 1628 may provide nonvolatile and/or volatile storage of machine-readable instructions, data structures, program modules, and/or other data for computer system 1600. In one example, software 1620 may reside, completely or partially, within machine-readable medium 1628. In another example, software 1620 may reside, completely or partially, within processor 1604.

Computer system 1600 may also include an input device 1632. In one example, a user of computer system 1600 may enter commands and/or other information into computer system 1600 via input device 1632. Examples of an input device 1632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1632 may be interfaced to bus 1612 via any of a variety of interfaces (not shown) including, but not limited to, a serial interface, a parallel interface, a game port, a USB interface, a FIREWIRE interface, a direct interface to bus 1612, and any combinations thereof. Input device 1632 may include a touch screen interface that may be a part of or separate from display 1636, discussed further below. Input device 1632 may be utilized as a user selection device for selecting one or more graphical representations in a graphical interface as described above.

A user may also input commands and/or other information to computer system 1600 via storage device 1624 (e.g., a removable disk drive, a flash drive, etc.) and/or network interface device 1640. A network interface device, such as network interface device 1640, may be utilized for connecting computer system 1600 to one or more of a variety of networks, such as network 1644, and one or more remote devices 1648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1644, may employ a wired and/or a wireless mode of communication. In general, any network topology may be used. Information (e.g., data, software 1620, etc.) may be communicated to and/or from computer system 1600 via network interface device 1640.

Computer system 1600 may further include a video display adapter 1652 for communicating a displayable image to a display device, such as display device 1636. Examples of a display device include, but are not limited to, a liquid crystal display (LCD), a cathode ray tube (CRT), a plasma display, a light emitting diode (LED) display, and any combinations thereof. Display adapter 1652 and display device 1636 may be utilized in combination with processor 1604 to provide graphical representations of aspects of the present disclosure. In addition to a display device, computer system 1600 may include one or more other peripheral output devices including, but not limited to, an audio speaker, a printer, and any combinations thereof. Such peripheral output devices may be connected to bus 1612 via a peripheral interface 1656. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for automatic pin placement in an injection molding process, wherein the apparatus comprises:
   at least a processor; and
   a memory communicatively connected to the at least a processor, wherein the memory contains instructions configuring the at least a processor to:
      receive part data related to at least a part, wherein the part data comprises a part model associated with the at least a part;
      identify a set of part features as a function of the part data;
      determine a plurality of pin placement configurations, wherein determining the plurality of pin placement configurations comprises:
         determine a plurality of pin locations based on the set of part features; and
         determine a desired pin diameter at each pin location of the plurality of pin locations;
      generate a pin placement schema as a function of the plurality of pin placement configurations; and
      integrate the pin placement schema into the part model, wherein the pin placement schema is implemented by placing one or more pins with predetermined pin diameters at locations on an injection molding machine corresponding to the pin placement schema, thereby ejecting the at least a part using the plurality of pins upon a completion of an injection molding process without causing deformation to the at least a part.

2. The apparatus of claim 1, wherein identifying the set of part features comprises:
   scanning the at least one part model; and
   extracting a plurality of part features based on the scan.

3. The apparatus of claim 2, wherein identifying the set of part features comprises:
   assigning a weight to each part feature of the plurality of part features; and
   identifying the set of part features by ranking the plurality of part features as a function of an associated weights.

4. The apparatus of claim 1, wherein determining the plurality of pin locations comprises determining the plurality of pin locations using a rule engine comprising a predetermined set of rules.

5. The apparatus of claim 1, wherein determining the desired pin diameter comprises:
   identifying a plurality of boundary elements based on one or more adjacent part features at each pin location of the plurality of pin locations.

6. The apparatus of claim 5, wherein determining the desired pin diameter comprises:
calculating a pin diameter threshold as a function of the plurality of boundary elements; and
determining the desired pin diameter as a function of the calculated pin diameter threshold.

7. The apparatus of claim 1, wherein determining the desired pin diameter comprises:
refining the desired pin diameter as a function of a plurality of additional boundary elements.

8. The apparatus of claim 1, wherein determining the plurality of pin placement configurations comprises:
training a pin placement machine learning model using pin placement training data, wherein the pin placement training data comprises a plurality of part features as input correlated to a plurality of pin placement configurations as output; and
determining the plurality of pin placement configurations as a function of the trained pin placement machine learning model.

9. The apparatus of claim 1, wherein integrating the pin placement schema further comprises:
implement the pin placement schema by placing a plurality of pins with desired pin diameters at locations on an injection molding machine corresponding to the plurality of pin locations, thereby ejecting the at least a part using the plurality of pins upon a completion of the injection molding process without causing deformation to the at least a part.

10. The apparatus of claim 1, wherein the memory further contains instructions configuring the at least a processor to display the generated pin placement schema to a user using a user interface at a display device.

11. A method for automatic pin placement in injection molding, the method comprises:
receiving, by at least a processor, part data related to at least a part, wherein the part data comprises a part model associated with the at least a part;
identifying, by the at least a processor, a set of part features as a function of the part data;
determining, by the at least a processor, a plurality of pin placement configurations, wherein determining the plurality of pin placement configurations comprises:
determining a plurality of pin locations based on the set of part features; and
determining a desired pin diameter at each pin location of the plurality of pin locations;
generating, by the at least a processor, a pin placement schema as a function of the plurality of pin placement configurations; and
integrating, by the at least a processor, the pin placement schema into the part model, wherein the pin placement schema is implemented by placing one or more pins with predetermined pin diameters at locations on an injection molding machine corresponding to the pin placement schema, thereby ejecting the at least a part using the plurality of pins upon a completion of an injection molding process without causing deformation to the at least a part.

12. The method of claim 11, wherein identifying the set of part features comprises:
scanning the part model; and
extracting a plurality of part features based on the scan.

13. The method of claim 12, wherein identifying the set of part features comprises:
assigning a weight to each part feature of the plurality of part features; and
identifying the set of part features by ranking the plurality of part features as a function of an associated weights.

14. The method of claim 11, wherein determining the plurality of pin locations comprises determining the plurality of pin locations using a rule engine comprising a predetermined set of rules.

15. The method of claim 11, wherein determining the desired pin diameter comprises:
identifying a plurality of boundary elements based on one or more adjacent part features at each pin location of the plurality of pin locations.

16. The method of claim 15, wherein determining the desired pin diameter comprises:
calculating a pin diameter threshold as a function of the plurality of boundary elements; and
determining the desired pin diameter as a function of the calculated pin diameter threshold.

17. The method of claim 15, wherein determining the desired pin diameter comprises:
refining the initial pin diameter as a function of a plurality of additional boundary elements.

18. The method of claim 11, wherein determining the plurality of pin placement configurations comprises:
training a pin placement machine learning model using pin placement training data, wherein the pin placement training data comprises a plurality of part features as input correlated to a plurality of pin placement configurations as output; and
determining the plurality of pin placement configurations as a function of the trained pin placement machine learning model.

19. The method of claim 11, wherein integrating the pin placement schema further comprises:
implementing the pin placement schema by placing a plurality of pins with desired pin diameters at locations on an injection molding machine corresponding to the plurality of pin locations, thereby ejecting the at least a part using the plurality of pins upon a completion of the injection molding process without causing deformation to the at least a part.

20. The method of claim 11, further comprises displaying the generated pin placement schema to a user using a user interface at a display device.

* * * * *